United States Patent
Ou et al.

(10) Patent No.: US 8,891,308 B1
(45) Date of Patent: Nov. 18, 2014

(54) DYNAMIC ERASE VOLTAGE STEP SIZE SELECTION FOR 3D NON-VOLATILE MEMORY

(71) Applicant: SanDisk Technologies Inc., Plano, TX (US)

(72) Inventors: Wendy Ou, San Jose, CA (US); Man L Mui, Santa Clara, CA (US); Yingda Dong, San Jose, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/023,920

(22) Filed: Sep. 11, 2013

(51) Int. Cl.
*G11C 16/04* (2006.01)
*G11C 16/16* (2006.01)

(52) U.S. Cl.
CPC .................................. *G11C 16/16* (2013.01)
USPC ............................. 365/185.17; 365/185.19

(58) Field of Classification Search
USPC .......................... 365/185.17, 185.19, 185.18
See application file for complete search history.

(56) References Cited

U.S. PATENT DOCUMENTS

| | | | |
|---|---|---|---|
| 6,188,609 B1 | 2/2001 | Sunkavalli et al. | |
| 6,246,610 B1 | 6/2001 | Han et al. | |
| 6,269,025 B1 | 7/2001 | Hollmer et al. | |
| 6,937,521 B2 | 8/2005 | Avni et al. | |
| 7,149,121 B2 | 12/2006 | Lin et al. | |
| 7,200,708 B1 | 4/2007 | Kreifels | |
| 7,457,166 B2 | 11/2008 | Hemink et al. | |
| 7,505,321 B2 * | 3/2009 | Scheuerlein et al. | 365/185.17 |
| 7,564,715 B2 | 7/2009 | Mokhlesi | |
| 7,606,091 B2 | 10/2009 | Li et al. | |
| 7,679,961 B2 | 3/2010 | Lee et al. | |
| 7,688,632 B2 | 3/2010 | Nagashima et al. | |
| 7,907,449 B2 | 3/2011 | Lee et al. | |
| 7,916,543 B2 | 3/2011 | Goda et al. | |
| 8,018,769 B2 | 9/2011 | Tu et al. | |
| 8,036,044 B2 | 10/2011 | Dong et al. | |
| 8,149,625 B2 | 4/2012 | Hwang | |
| 8,264,885 B2 | 9/2012 | Goda et al. | |
| 8,305,804 B2 | 11/2012 | Kim et al. | |
| 8,320,185 B2 | 11/2012 | Marquart | |
| 8,374,036 B2 | 2/2013 | Jeong et al. | |
| 2011/0013460 A1 | 1/2011 | Dong et al. | |

OTHER PUBLICATIONS

U.S. Appl. No. 14/279,611, filed May 16, 2014.

* cited by examiner

*Primary Examiner* — Huan Hoang
(74) *Attorney, Agent, or Firm* — Vierra Magen Marcus LLP

(57) ABSTRACT

Techniques are provided for erasing memory cells in a 3D stacked non-volatile memory device in a way which avoids prolonging erase time as the erase speed deceases due to the accumulation of program-erase cycles. In particular, a step size for erase pulses can be set which is a function of the number of program-erase cycles, e.g., as indicated by a count of program-erase cycles, a loop count during programming which is a function of programming speed, or an initial program voltage which is a function of programming speed. Further, the erase operation can account for different erase speeds of memory cells in different word line layers.

20 Claims, 24 Drawing Sheets

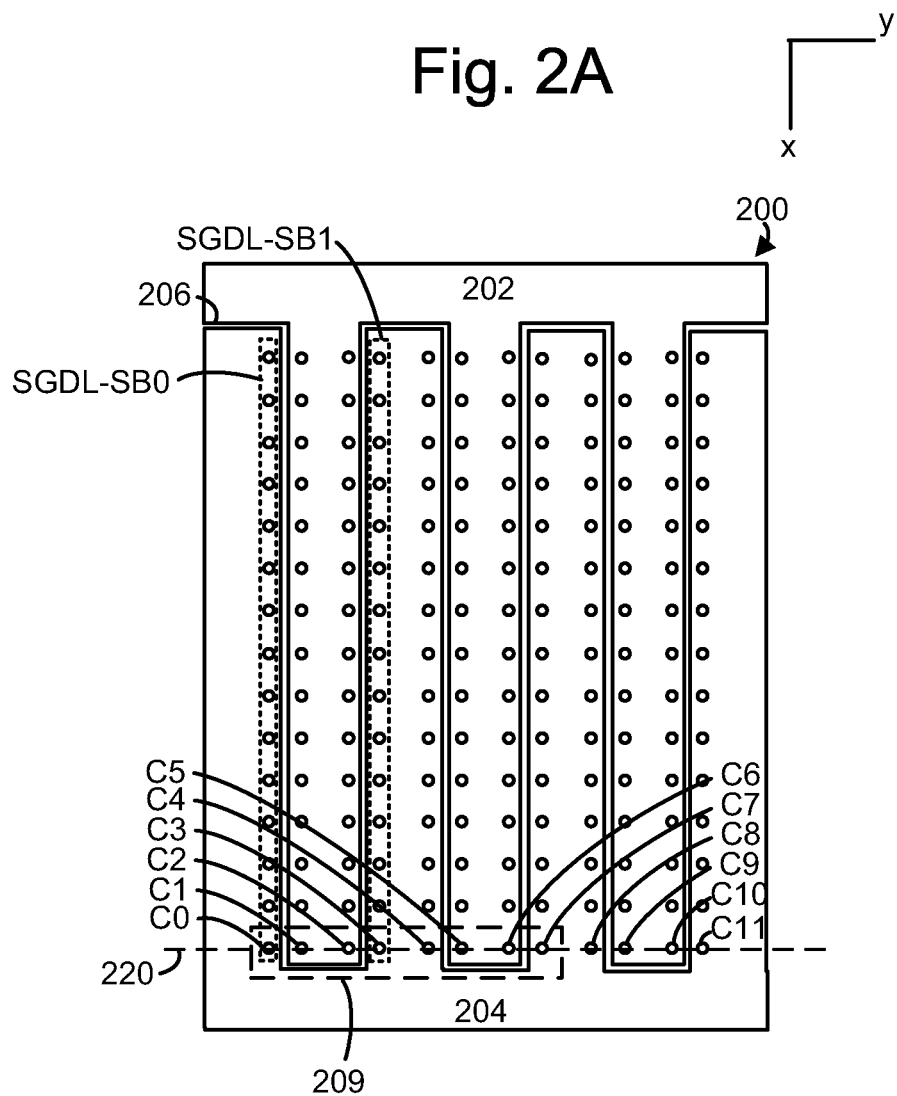

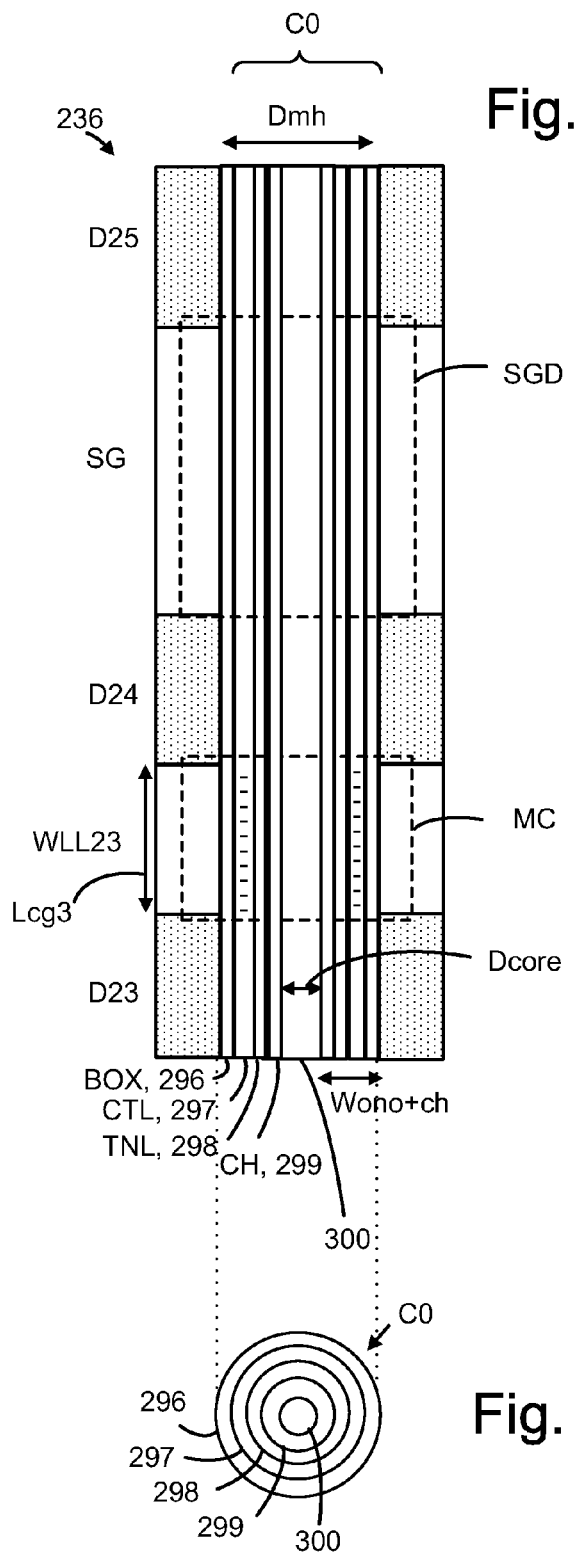

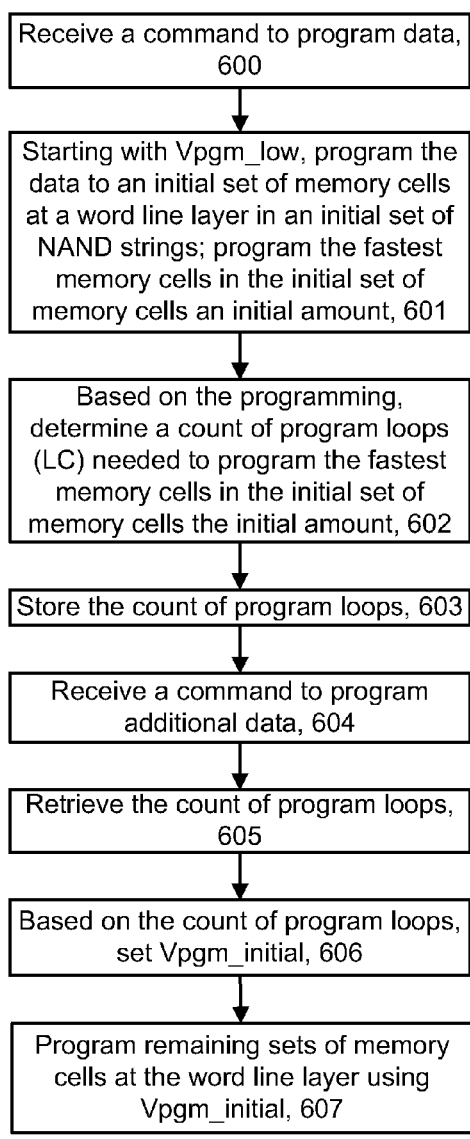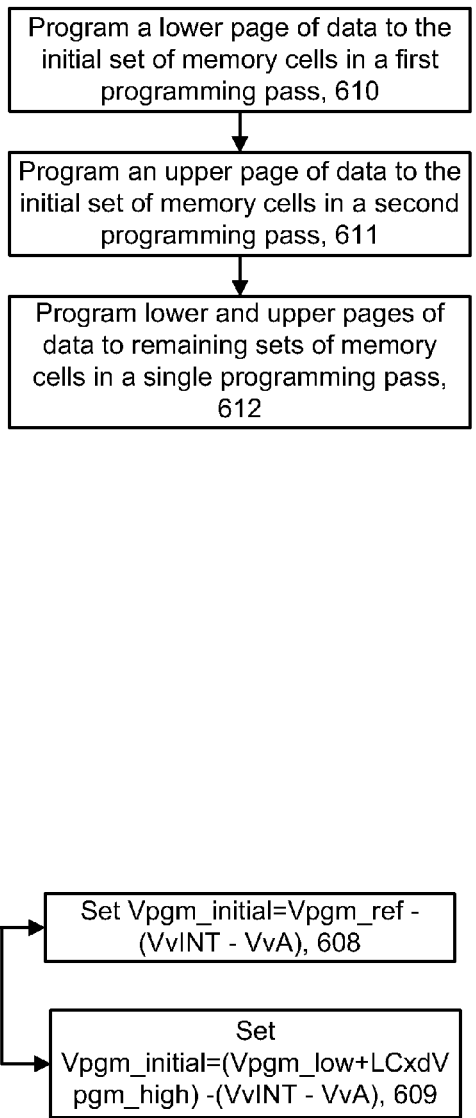

DYNAMIC ERASE VOLTAGE STEP SIZE SELECTION FOR 3D NON-VOLATILE MEMORY

BACKGROUND

The present technology relates to techniques for erasing memory cells in a 3D non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 3A depicts a close-up view of the region 236 of the column C0 of FIG. 2H, showing a drain-side select gate transistor SGD in the SG layer and a memory cell MC in word line layer WLL23.

FIG. 3B depicts a cross-sectional view of the column C0 of FIG. 3A.

FIG. 6A depicts a flowchart of an example programming operation in which Vpgm_initial is optimized, in accordance with step 516 of FIG. 5B.

FIG. 6B depicts an example process for carrying out the programming operation of FIG. 6A when programming lower and upper pages of data.

FIG. 14F is a plot depicting a control setting of a step size of an erase voltage, dVerase, as a function of a loop count which is determined during a programming operation in accordance with.

FIG. 14G is a plot depicting a control setting of a step size of an erase voltage, dVerase, as a function of Vpgm_initial, which is determined during a programming operation in accordance with.

DETAILED DESCRIPTION

Figure 1A:
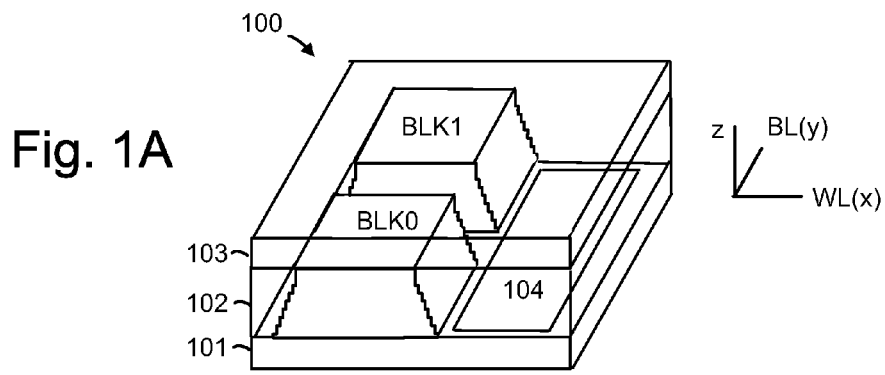
FIG. 1A is a perspective view of a 3D stacked non-volatile memory device.

Techniques are provided for erasing memory cells in a 3D stacked non-volatile memory device in a way which accounts for changes in the memory device as program-erase cycles (p-e cycles) are accumulated. The techniques avoid degradation which can be caused by over-erase while avoiding prolonging erase time as the erase speed deceases due to the accumulation of p-e cycles.

In such a memory device, memory cells are formed along memory holes which extend through alternating conductive layers (word line layers) and dielectric layers in a stack. The memory cells are typically arranged in NAND strings. Each NAND string has an individual thin polysilicon body as a channel, where the bias of the channel can be controlled by bit line (BL), source line (SL), drain-side select gate (SGD) and source-side select gate (SGS) voltages. During an erase operation, the SGD and/or SGS transistors are biased to cause a gate-induced drain leakage (GIDL) current in the body which charges up the body, e.g., raising its voltage. For example, an erase voltage can be applied to the bit line and/or source line. At the same time, a voltage of the conductive layers is floated. When the body is in a fully charged state, the voltage of the conductive layers is driven down sharply to a low level such as 0 V to create an electric field across the tunnel oxide which causes holes to be injected from the memory cell's body to the charge trapping layer, resulting in a large Vth downshift toward an erase-verify level. This process can be repeated in successive iterations until an erase-verify condition is met, in some approaches. Moreover, the erase voltage can be stepped up by a step size in each successive iteration.

Further, an erase operation can be one-sided or two-sided. In a two-sided erase, the erase voltage is applied to the SGD and SGS transistors via the bit line and source line, respectively, so that GIDL is generated at the drain and source ends of each NAND string. In a one-sided erase, the erase voltage is applied to the SGD transistors via the bit line so that GIDL is generated at the drain end of each NAND string.

An erase operation for a 3D stacked non-volatile memory device is therefore substantially different than for a 2D NAND structure, where an erase voltage is applied to a p-well substrate which is common to all NAND strings. Another different is that the erase pulses may be longer for 3D NAND vs. 2D NAND due to the time needed to charge up the channel in 3D NAND.

It has been found that memory cell degradation is very sensitive to the erase depth. In particular, over-erase can significantly reduce the endurance of the memory cells. A relatively small erase voltage step size can be used to avoid over-erase. At the same time, evidence shows that after heavy program-erase cycling, the erase speed of the memory cells decreases and the erase slope (a ratio of a change in threshold voltage to a change in the erase voltage, or dVth/dVerase) also becomes shallower. These changes can increase the number of erase loops (or erase-verify iterations) which are needed to complete an erase operation. As a result, the total erase time can become unacceptably long.

Techniques provided herein address the above-mentioned issues by adjusting the erase voltage step size (dVerase) as the memory device becomes cycled. In one approach, data is maintained which is indicative of the number of p-e cycles. For example, this data can be a count of p-e cycles (a "hot count") of a block, or other unit, of memory cells. A controller, such as a state machine, can use the data to determine an optimal erase voltage step size (dVerase) at the start of an erase operation. The step size can be dynamically increased as the count of p-e cycles increases.

In another approach, the data which is indicative of the number of p-e cycles is a loop count from a programming operation, and/or an initial program voltage, Vpgm_initial, which is based on the loop count. The loop count is a number of program loops (or program-verify iterations) which are needed to program the fastest memory cells in an initial set of memory cells an initial amount. A separate loop count can be determined for each word line layer of memory cells, or for groups of word lines layers which have a common memory hole diameter, and stored in a specified non-volatile location within the memory cells or in a separate data register. As the memory device becomes cycled, the programming speed increases so that the loop count decreases. A relatively lower loop count, or a lower Vpgm_initial, is therefore indicative of a relatively higher number of p-e cycles. The loop count is maintained as part of a smart verify scheme to dynamically update Vpgm_initial as the programming speed of the memory device increases due to accumulated p-e cycles.

Since loop count and Vpgm_initial are already available, they can be used during an erase operation at no cost. The loop count or Vpgm_initial, or associated values derived from them, are a strong indicator of the number of p-e cycles.

In another approach, the controller determines an optimal erase voltage step size (dVerase2) during the erase operation, after an initial erase voltage (Verase_initial_a) has been applied to the NAND strings. In this smart erase verify scheme, a metric is determined for the Vth distribution of the memory cells which results after the initial erase voltage is applied. The metric can indicate a distance in Volts between an upper tail of the Vth distribution and the erase-verify voltage. When this metric is relatively larger, the memory cells have a relatively longer way to go to reach the erased state. Accordingly, the second erase voltage should be relatively larger. Further, the second erase voltage should be relatively larger still when the number of p-e cycles in relatively larger. To achieve this, the control can determine a slope (dVth/dVerase) as a function of p-e cycles, determine a step size (dVerase2) as a function of p-e cycles from: metric/slope, and determine the second erase voltage (Verase2_a) based on: Verase_initial_a+dVerase2. This improves the accuracy of the second erase voltage by accounting for the number of p-e cycles. Without this approach, the second erase voltage would be lower than optimal.

The following discussion provides details of the construction of a memory device and of related erase techniques which address the above-mentioned issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
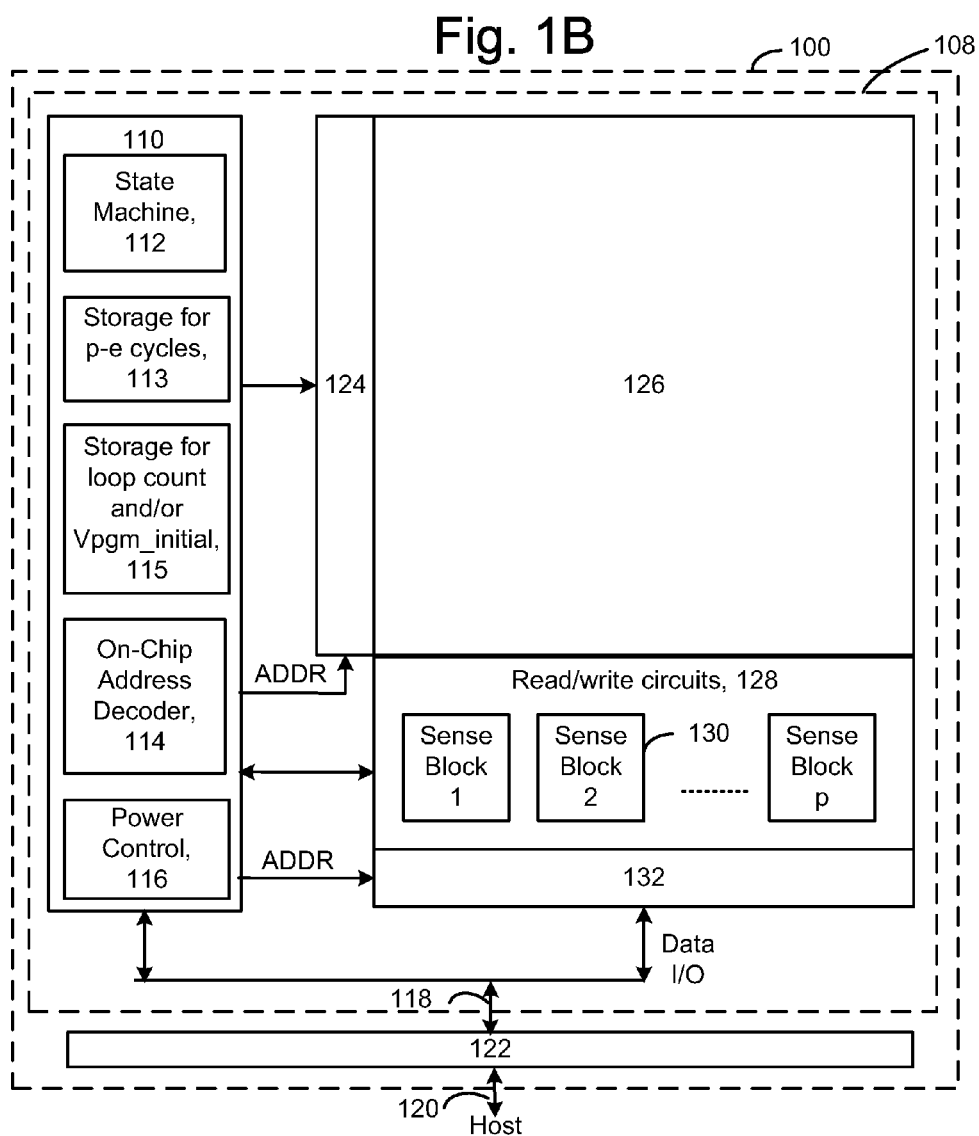
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array 126 of memory cells, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs and WLL portions, drain- and source-side select gate drivers (referring, e.g., to drain- and source-sides or ends of a string of memory cells such as a NAND string, for instance) and source lines. The sense blocks 130 can include bit line drivers, in one approach.

A storage location 113 for a count of program-erase (p-e) cycles may also be provided. The count can be incremented each time an erase operation is performed in the memory array 126, for instance. A storage location 115 for current value of loop count and/or Vpgm_initial, where these parameters can be dynamically updated as the programming performance of the memory array changes due to increasing p-e cycles. The storage locations may use data registers, for example.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another approach, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half Other types of non-volatile memory in addition to NAND flash memory can also be used.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2H, the stack includes alternating dielectric and conductive layers. The dielectric layers include D0 to D25 and may be made of SiO2, for instance. The conductive layers include BG, which is a back gate layer, WLL0 to WLL23, which are WLLs, e.g., conductive paths to control gates of the memory cells at the layer, and SG, which is a select gate layer, e.g., a conductive path to control gates of select gate transistors of NAND strings. The word line layer (WLL) of FIG. 2A may represent any one of WLL0 to WLL23, for instance, in an example with twenty-four WLLs. The conductive layers may include doped polysilicon or metal silicide, for instance. An example voltage of 5-10 V may be applied to the back gate to maintain a conductive state which connects the drain- and source-side columns.

For each block, the WLL is divided into two WLL portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2H.

Figure 2B:
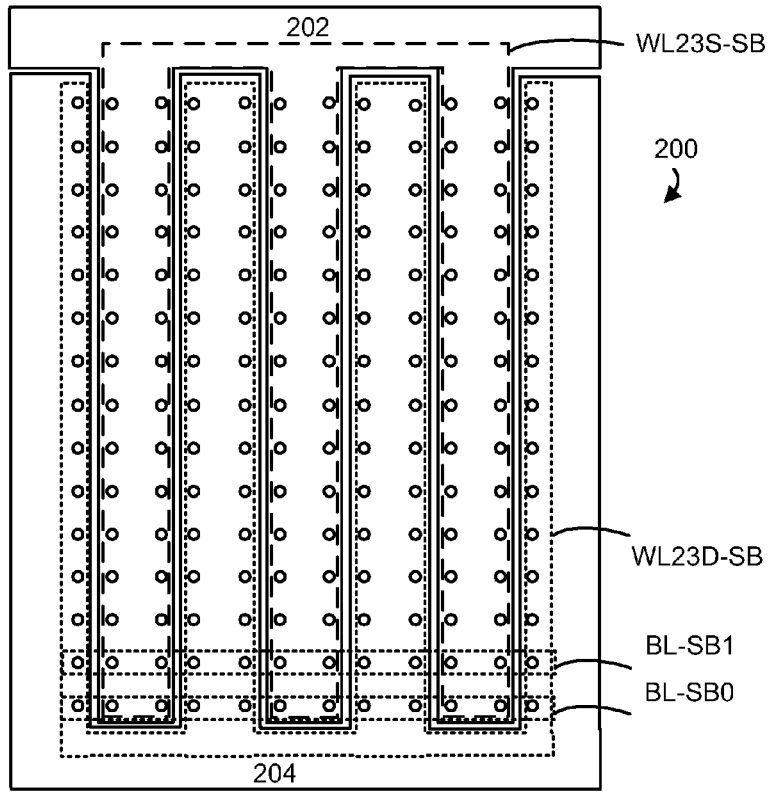
FIG. 2B depicts the block 200 FIG. 2A, showing example word line subsets WL23D-SB and WL23S-SB and example bit line subsets BL-SB0 and BL-SB1.

FIG. 2B depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one (e.g., exactly one) memory cell in the source-side of each U-shaped NAND string, and WLL23D-SB is a WLL portion in communication with one (e.g., exactly one) memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2H) of NAND strings, and the columns of memory cells on the other side of the slit are source-side columns (e.g., C1, C2, C5 and C6 in FIG. 2H) of the NAND strings. Note that the pattern of two source-side columns between two drain-side columns repeats in the y-direction.

Word line drivers can independently provide voltage waveforms to the WLL portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set.

A set of NAND strings 210 of the block 200 is described further below in connection with FIG. 2G. This represents a set of NAND strings which have SGD transistors controlled by a common SGD line. In one approach, this also represents a unit of memory cells which are programmed. Additional sets of NAND strings 211-215 are also depicted.

Figure 2C:
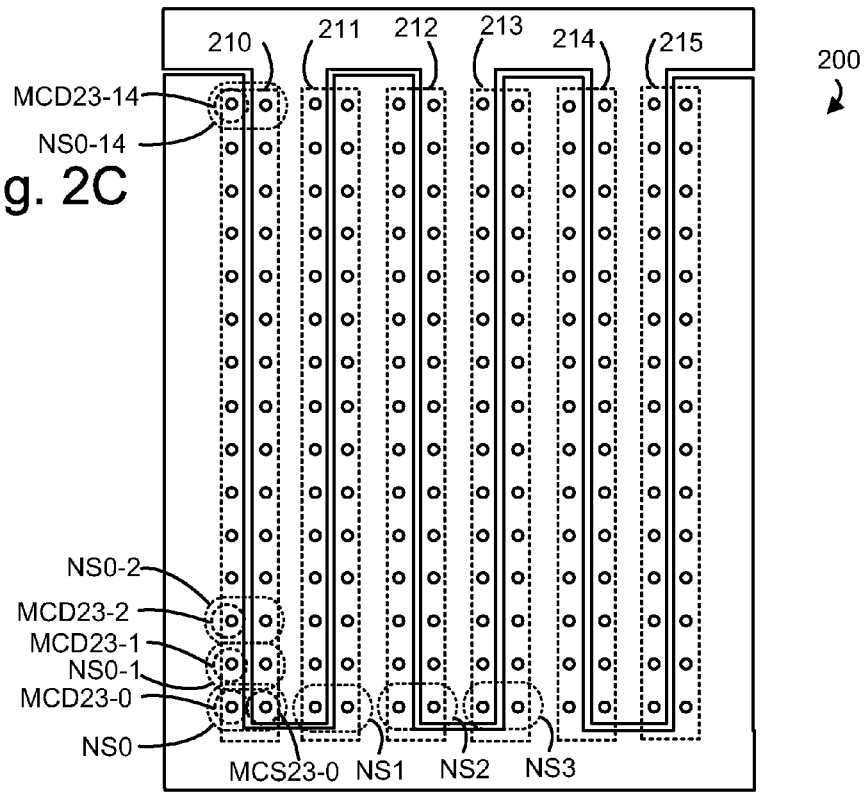
FIG. 2C depicts the block 200 FIG. 2A, showing example sets of NAND strings 210-215.

FIG. 2C depicts the block 200 FIG. 2A, showing example sets of NAND strings 210-215. The set of NAND strings 210 includes an example NAND string NS0, such as depicted in FIG. 2F and example memory cells MCD23-0, MCD23-1, MCD23-2, . . . , MCD23-14, as depicted in FIG. 2G. In this notation, "MC" denotes a memory cell, "D" denotes a drain side of the NAND strings, and the number (0, 1, 2, . . . , 14) denotes a number of the NAND string based on its position in the stack. NAND strings NS1, NS2 and NS3 are also depicted (see, e.g., FIG. 2B).

Figure 2D:
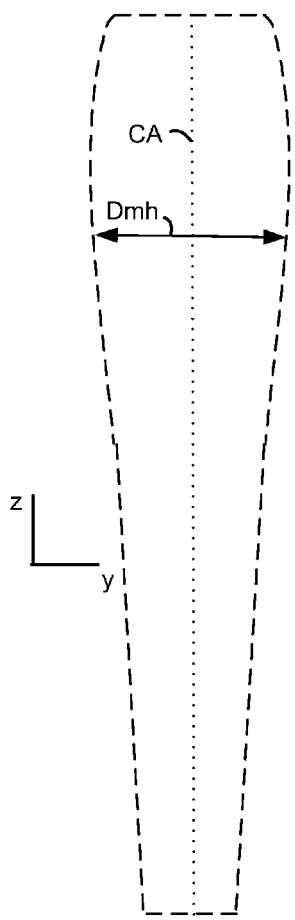
FIG. 2D depicts a cross-sectional width of a memory hole which flares out to a widest region near the top and is then tapered toward the bottom.
Figure 2F:
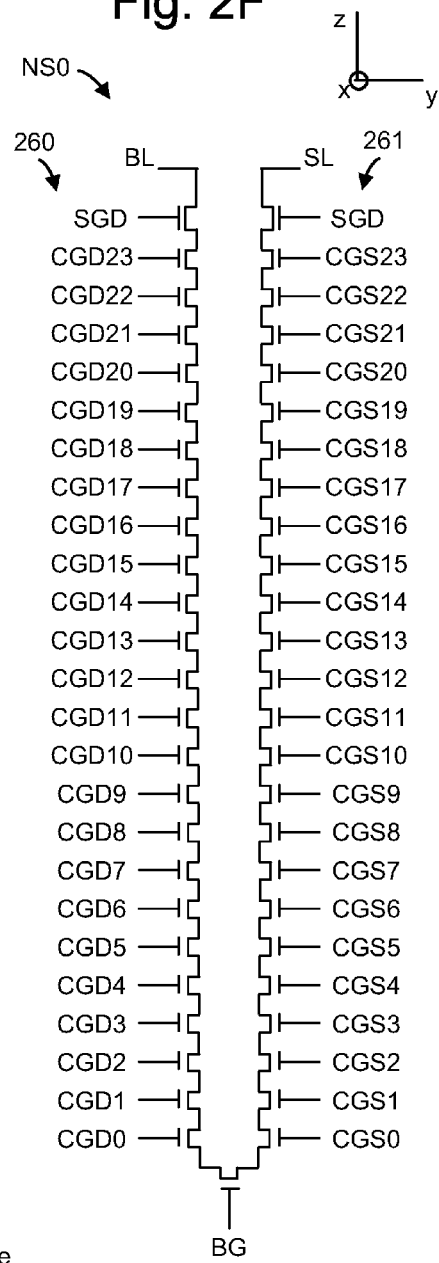
FIG. 2F depicts the example NAND string NS0 of FIG. 2C, where memory cells are arranged in groups having a similar memory hole diameter based on FIG. 2D.

FIG. 2D depicts a cross-sectional width of a memory hole which flares out to a widest region near the top and is then tapered toward the bottom. The memory hole diameter (Dmh) can vary along a length of a memory hole as represented by a central axis CA. The memory hole diameters can vary in different ways depending on the process used to create them. In this example, the memory hole flares out to a widest region near the top and is then tapered toward the bottom. An assumption is that the memory hole diameters vary in a similar way for a set of memory holes in a block so that the diameter is similar within a WLL, but different in different WLLs. The memory hole diameter is a function of the z coordinate (elevation or height) in the stack. In another possible configuration, the memory hole is uniformly tapered from top to bottom.

Figure 2E:
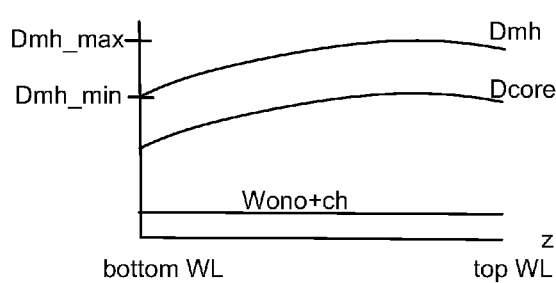
FIG. 2E depicts a variation in memory hole diameter in a stack of word line layers (WLLs), corresponding to FIG. 2D.

FIG. 2E depicts a variation in memory hole diameter (Dmh) in a stack of WLLs, corresponding to FIG. 2D. Generally, Dmh varies in a stack of WLLs, in the vertical direction. The horizontal axis represents a distance in a stack ranging from a bottom word line to a top word line. As mentioned, the diameter tends to decrease toward the bottom of the stack. Dmh ranges from a minimum diameter, Dmh_min to a maximum diameter, Dmh_max. Dmh is expected to vary consistently among different memory holes in the memory device.

As explained further below in connection with FIGS. 3A and 3B, Dcore is a diameter of the core region of a memory hole and tends to vary with Dmh, and Wono+ch is the sum of the widths of an ONO region and a channel region. Wono+ch tends to be uniform in a memory hole since these materials are deposited on sidewalls of the memory holes after the memory holes are formed.

FIG. 2F depicts the example NAND string NS0 of FIG. 2C, where memory cells are arranged in groups having a similar memory hole diameter based on FIG. 2D. The example NAND string has a drain side 260 which extends between a bit line (BL) and a back gate (BG), and a source side 261 which extends between a source line (SL) and the BG. The drain side includes a SGD transistor and memory cells represented by control gates CGD0-CGD23. The source side includes a SGS transistor and memory cells represented by control gates CGS0-CGS23. The control gate are provided by respective word line layers. Optionally, one or more dummy transistors on each side can be provided.

Figure 2G:
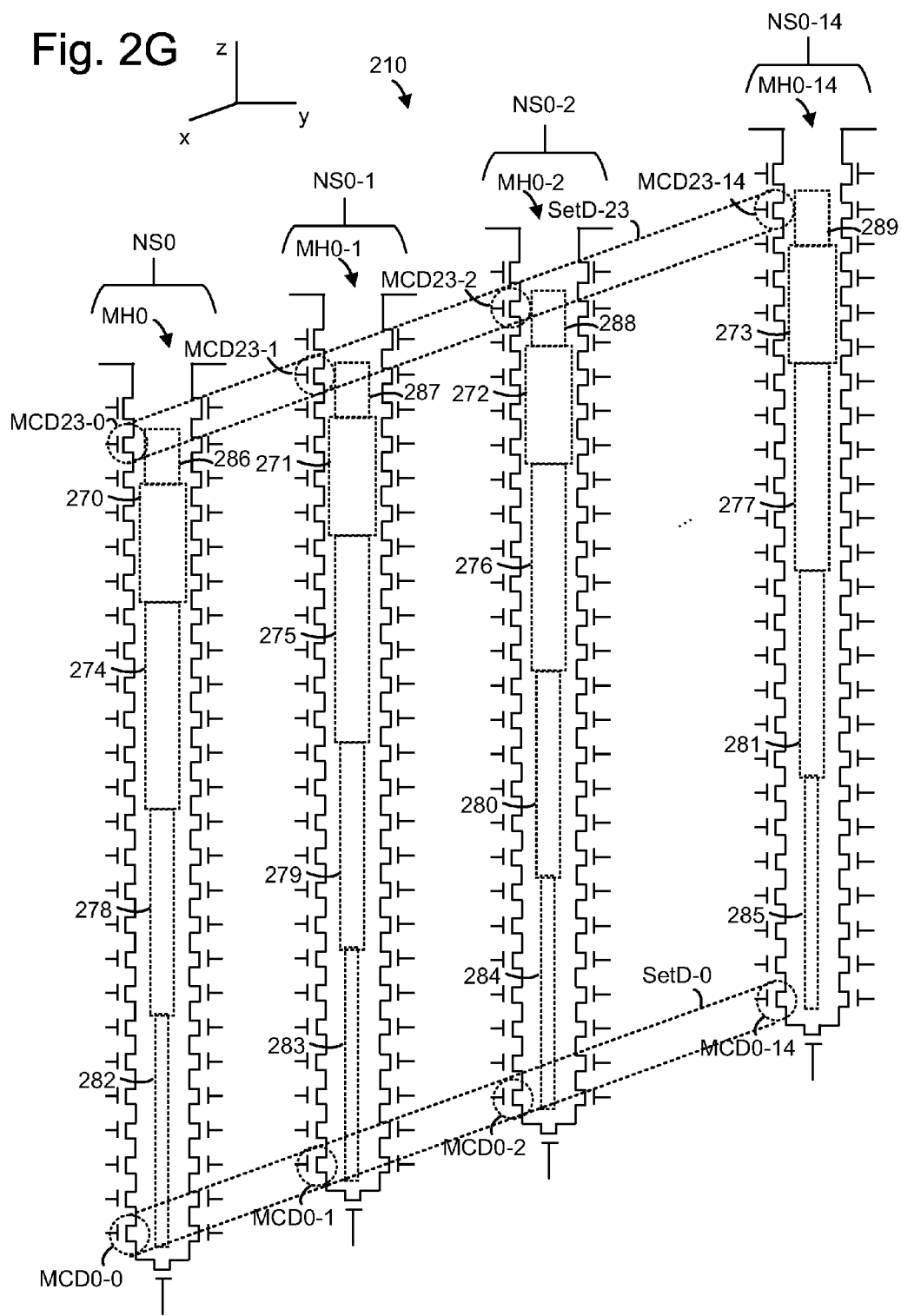
FIG. 2G depicts the example NAND strings NS0, NS0-1, NS0-2, . . . , NS0-14 of FIG. 2C.
Figure 2H:
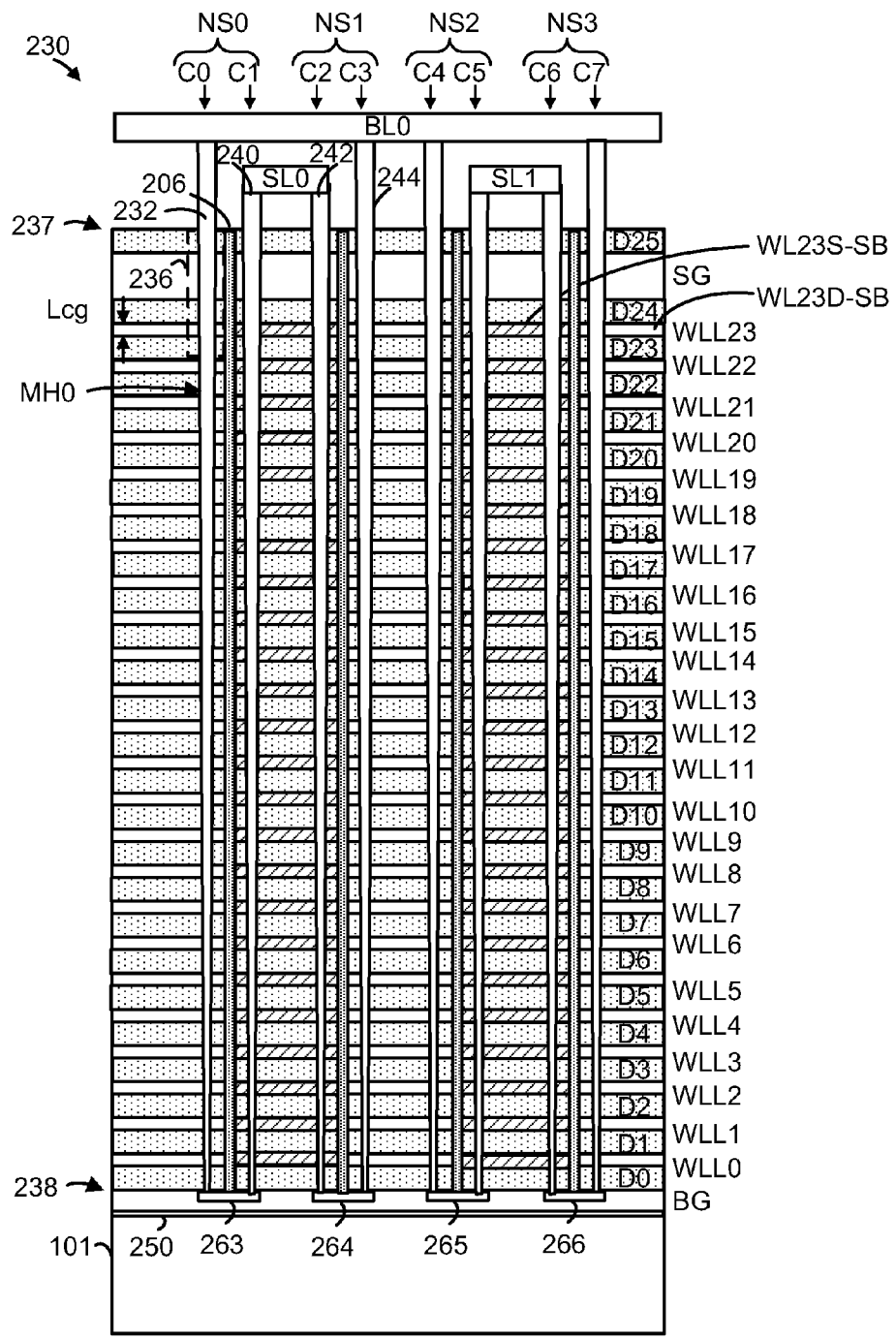
FIG. 2H depicts an embodiment of a stack 230 showing a cross-sectional view of the portion 209 of the block 200 of FIG. 2A, along line 220.

FIG. 2G depicts the example NAND strings NS0, NS0-1, NS0-2, . . . , NS0-14 of FIG. 2C of the set of NAND strings 210. A set of memory cells SetD-23 encompasses all of the memory cells on the drain sides of the set of NAND strings at WLL23, including MCD23-0, MCD23-1, MCD23-2, . . . , MCD23-14. These memory cells are adjacent to portions of respective memory holes MH0, MH0-1, MH0-2, . . . , MH0-14, which have a relatively wide diameter and can therefore by treated similarly in programming and sensing operations. Another example set of memory cells SetD-0 encompasses all of the memory cells on the drain sides of the NAND strings at WLL0, including MCD0-0, MCD0-1, MCD0-MCD0-14. These memory cells are adjacent to portions of respective memory holes which have a relatively narrow diameter and can therefore by treated similarly in programming and sensing operations. Additional sets of memory cells can be defined in a set of NAND string at each of the WLLs.

Portions of the memory holes are depicted as having varying diameters consistent with the groups of FIG. 2F. For example, MH0 includes portions 286, 270, 274, 278 and 282, MH0-1 includes portions 287, 271, 275, 279 and 283, MH0-2 includes portions 288, 272, 276, 280 and 284, and MH0-14 includes portions 289, 273, 277, 281 and 285. G0 includes portions 282-285, G1 includes portions 278-281, G2 includes portions 274-277 and 286-289 and G3 includes portions 274-277. As a simplification, the memory hole diameters (Dmh)

are shown as decreasing in uniform steps. In practice, the memory hole diameters tend to vary gradually as such as shown in FIG. 2D.

FIG. 2H depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0 from FIG. 2G, corresponding to C0, is depicted for reference. The memory hole is considered to be present in the final memory device even though the memory hole is filled in. As a simplification of the narrow-wide-narrow profile of FIG. 2G, the memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs.

The source line SL0 is connected to the source ends 240 and 242 of two adjacent memory strings NS0 and NS1. SL0 is also connected to other sets of memory strings which are behind NS0 and NS1 in the x direction. Recall that additional U-shaped NAND strings in the stack 230 (e.g., NS0-1, NS0-2, . . . , NS0-14 from FIG. 2G) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

FIG. 3A depicts a close-up view of the region 236 of the column C0 of FIG. 2H, showing a drain-side select gate transistor SGD in the SG layer and a memory cell MC in word line layer WLL23. Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B. In each WLL, the diagonal line patterned region represents the source-side sub-block, and the unpatterned region represents the drain-side sub-block.

The region also shows portions of the dielectric layers D23 to D25. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 296, a nitride such as SiN as a charge trapping layer (CTL) can be deposited as layer 297 and a tunnel oxide (TNL) can be deposited as layer 298, to provide the O—N—O layers. Further, a polysilicon body or channel (CH) can be deposited as layer 299, and a core filler dielectric can be deposited as region 300. Additional memory cells are similarly formed throughout the columns. Dmh represents the memory hole diameter, and Dcore represents the core diameter, which can both vary along the length or longitudinal axis of the memory hole, as discussed in connection with FIG. 2E. Lcg3 represents the thickness of WLL23 and the control gate length for each memory cell in WLL23. Wono+ch, discussed previously, is also depicted.

When a memory cell is programmed, electrons are stored in a portion of the CTL which is associated with the memory cell. For example, electrons are represented by "−" symbols in the CTL 297 for the MC. These electrons are drawn into the CTL from the channel, and through the TNL. The Vth of a memory cell is increased in proportion to the amount of stored charge. As mentioned, electrons can become trapped in the CTL as additional p-e cycles are experienced. This makes the erase speed slower.

Each of the memory holes is filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes. Further, the diameter of the memory hole (Dmh) varies along a memory hole based on a variation in the diameter of the core region (Dcore) based on the assumption that Wono+ch is fixed, where Dcore+Wono+ch=Dmh.

FIG. 3B depicts a cross-sectional view of the column C0 of FIG. 3A. Each layer is ring-shaped in one possible approach, except the core filler, which is a tapered cylinder.

Figure 4:
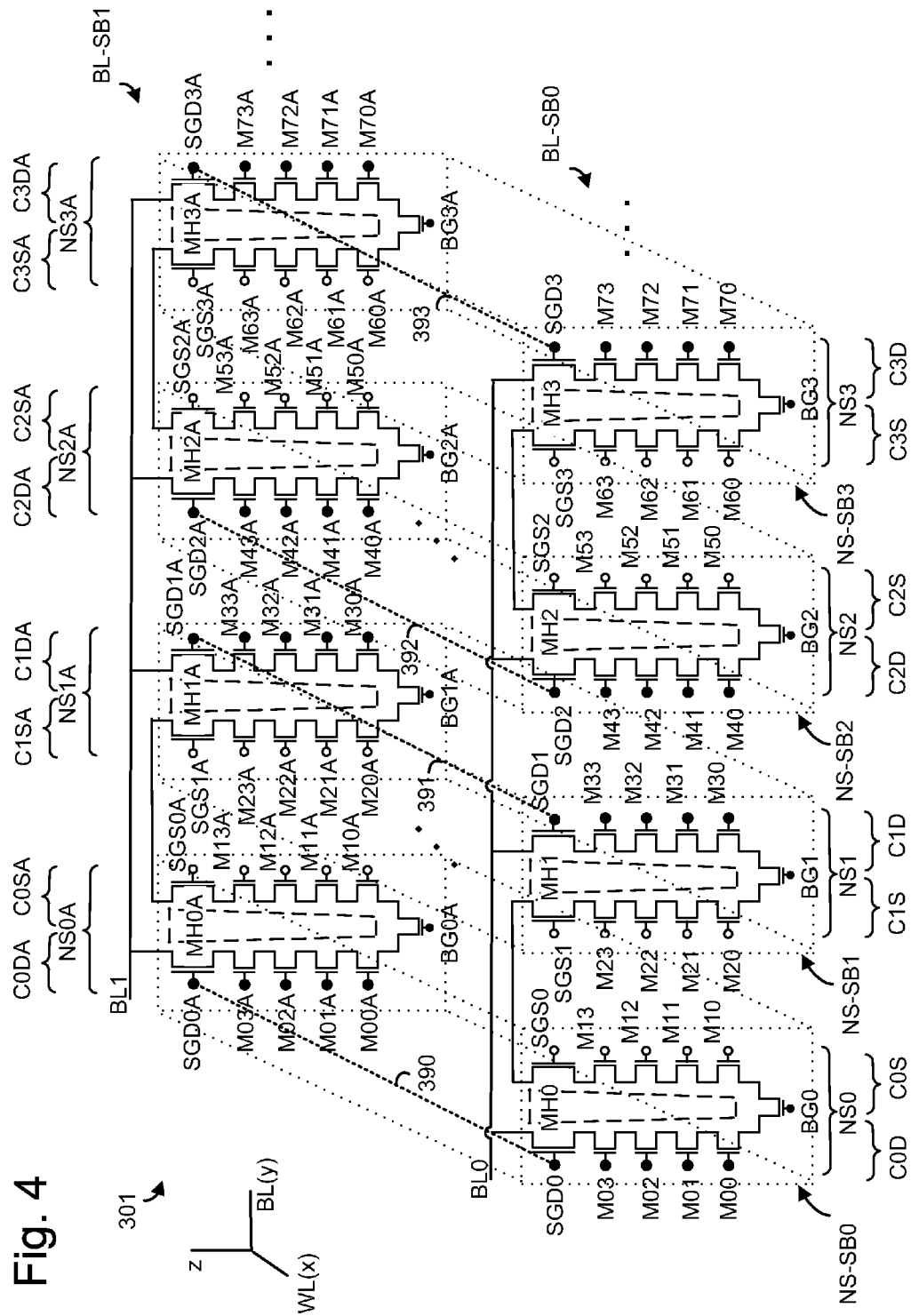
FIG. 4 depicts one embodiment of a circuit 301 for the NAND string sub-blocks NS-SB0 to NS-SB3 of FIG. 2A.

FIG. 4 depicts one embodiment of a circuit 301 for the showing example sets (or sub-blocks) of NAND strings 210-215 of FIG. 2A. As a simplification, four memory cells are provided per column. A set NS-SB0 includes NS0, . . . , NS0A, a set NS-SB1 includes NS1, . . . , NS1A, a set NS-SB2 includes NS2, . . . , NS2A and a set NS-SB3 includes NS3, . . . , NS3A. Each NAND string has memory cells along a respective memory hole. For example, NS-SB0 includes memory holes MH0, . . . , MH0A, NS-SB1 includes memory holes MH1, . . . , MH1A, NS-SB2 includes memory holes MH2, . . . , MH2A and NS-SB3 includes memory holes MH3, . . . , MH3A.

NAND strings NS0, NS1, NS2 and NS3 are in communication with a bit line BL0 (a first bit line) in BL-SB0 (a first bit line sub-block), and NAND strings NS0A, NS1A, NS2A and NS3A are in communication with a bit line BL1 (a second bit line) in BL-SB1 (a second bit line sub-block). In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side column CM comprising memory cells M30, M31, M32 and M33 and an SGD transistor SGD1, and a source side column C1S comprising memory cells M20, M21, M22 and M23 and an SGS transistor SGS1. NS2 has a drain side column C2D comprising memory cells M40, M41, M42 and M43 and an SGD transistor SGD2, and a source side column C2S comprising memory cells M50, M51, M52 and M53 and an SGS transistor SGS2. NS3 has a drain side column C3D comprising memory cells M70, M71, M72 and M73 and an SGD transistor SGD3, and a source side column C3S comprising memory cells M60, M61, M62 and M63 and an SGS transistor SGS3.

Similarly, NS0A has a drain side column C0DA comprising memory cells M00A, M01A, M02A and M03A and an SGD transistor SGD0A, and a source side column C0SA comprising memory cells M10A, M11A, M12A and M13A and an SGS transistor SGS0A. NS1A has a drain side column C1DA comprising memory cells M30A, M31A, M32A and M33A and an SGD transistor SGD1A, and a source side column C1SA comprising memory cells M20A, M21A, M22A and M23A and an SGS transistor SGS1A. NS2A has a drain side column C2DA comprising memory cells M40A, M41A, M42A and M43A and an SGD transistor SGD2A, and a source side column C2SA comprising memory cells M50A, M51A, M52A and M53A and an SGS transistor SGS2A. NS3A has a drain side column C3D comprising memory cells M70A, M71A, M72A and M73A and an SGD transistor SGD3A, and a source side column C3SA comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

At each level of the circuit, the control gates of the drain-side memory cells are connected to one another by a common WLL. For example, M03, M03A, M33, M33A, M43, M43A, M73 and M73A have control gates connected by a word line layer WL3D, consistent with FIG. 2B. M13, M13A, M23, M23A, M53, M53A, M63 and M63A have control gates connected by a word line layer WL3S, consistent with FIG. 2B.

M02, M02A, M32, M32A, M42, M42A, M72 and M72A have control gates connected by a word line layer WL2D. M12, M12A, M22, M22A, M52, M52A, M62 and M62A have control gates connected by a word line layer WL2S.

M01, M01A, M31, M31A, M41, M41A, M71 and M71A have control gates connected by a word line layer WL1D. M11, M11A, M21, M21A, M51, M51A, M61 and M61A have control gates connected by a word line layer WL1S.

M00, M00A, M30, M30A, M40, M40A, M70 and M70A have control gates connected by a word line layer WL0D. M10, M10A, M20, M20A, M50, M50A, M60 and M60A have control gates connected by a word line layer WL0S.

Additionally, control gates of the SGD transistors are connected to one another in respective NAND string sub-blocks. For example, in NS-SB0, control gates of SGD0, . . . , SGD0A are connected by path 390. In NS-SB1, control gates of SGD1, . . . , SGD1A are connected by path 391. In NS-SB3, control gates of SGD2, . . . , SGD2A are connected by path 392. In NS-SB3, control gates of SGD3, . . . , SGD3A are connected by path 393.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

Optionally, in a straight NAND string embodiment, a NAND string has only one column, and the source-side select gate is on the bottom of the column instead of on the top, as in a U-shaped NAND string. Moreover, a given level of a block has one WLL which is connected to each of the memory cells of the layer.

Figure 5A:
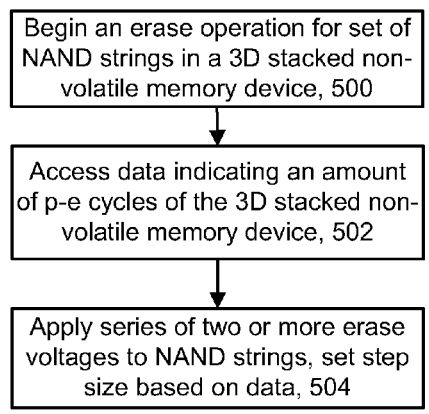
FIG. 5A depicts a process for erasing memory cells based on an amount of program-erase cycles.

FIG. 5A depicts a process for erasing memory cells based on an amount of p-e cycles. Step 500 involves beginning an erase operation for a set of NAND strings in a 3D stacked non-volatile memory device. For example, a control may issue an erase command. Further, the erase command can involve all, or a subset, of the memory cells and/or NAND strings in a block or array. Step 502 involves accessing data indicating an amount of p-e cycles of the 3D stacked non-volatile memory device. For example, this can be a count of p-e cycles, a loop count, or an initial program voltage, which is stored in a storage location. This data can be maintained over time and be available at the start of an erase operation. The accessing of the data can involve reading the data from the storage location, for instance. Step 504 involves applying a series of two or more erase voltages (erase pulses) to the NAND strings, where a step size is set based on the data. In one approach, the step size is set before the initial erase voltage is applied. In another approach, the step size is set after the initial erase voltage is applied, based on a metric of a Vth distribution of the memory cells and a slope of dVth/dVerase. In one approach, a constant step size is used for each subsequent erase voltage after the initial erase voltage.

Figure 5B:
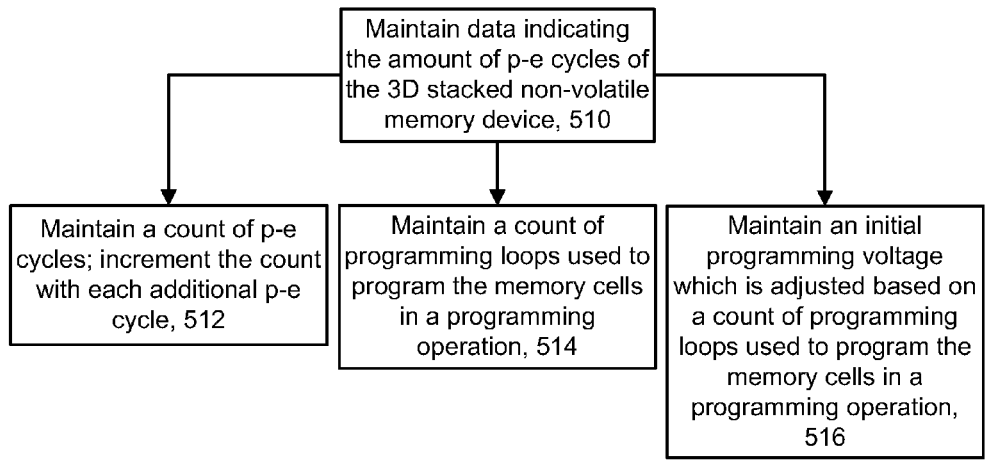
FIG. 5B depicts an example of a process to maintain data indicating the amount of program-erase cycles according to step 502 of FIG. 5A.

FIG. 5B depicts an example of a process to maintain data indicating the amount of p-e cycles according to step 502 of FIG. 5A. Step 510 includes maintaining data indicating the amount of p-e cycles of the 3D stacked non-volatile memory device. This can involve one or more of the following steps, for instance. Step 512 involves maintaining a count of p-e cycles, and incrementing the count with each additional program-erase cycle. Step 514 involves maintaining a count of programming loops used to program the memory cells in a programming operation. In one option, the count is obtained by programming at least a subset of a set of selected memory cells. Step 516 involves maintaining an initial programming voltage which is adjusted based on the count of programming loops.

Figure 5C:
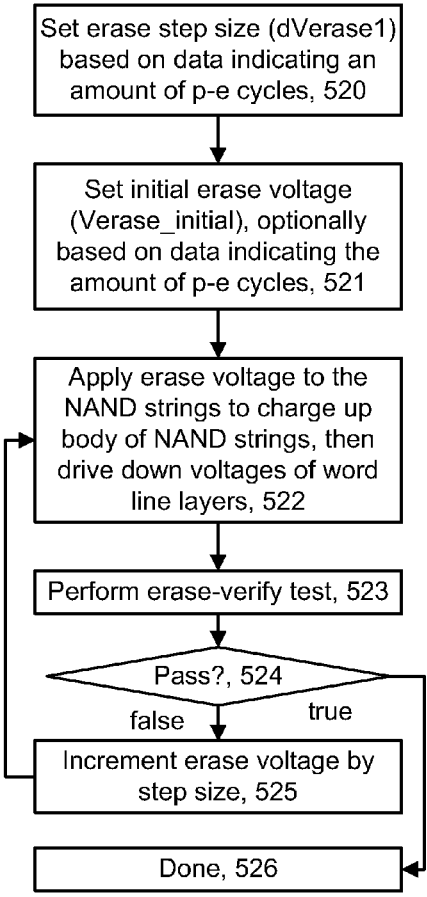
FIG. 5C depicts an example of an erase process according to step 504 of FIG. 5A, where the step size is determined based on data indicating an amount of program-erase cycles.

FIG. 5C depicts an example of an erase process according to step 504 of FIG. 5A, where the step size is determined based on data indicating an amount of p-e cycles. Step 520 sets an erase step size (dVerase1, see FIG. 9C) based on data indicating an amount of p-e cycles. For example, the control can obtain dVerase1 by reading the plot of FIG. 14E using a count of p-e cycles, by reading the plot of FIG. 14F using a loop count or by reading the plot of FIG. 14G using Vpgm_initial. Step 521 sets an initial erase voltage, which is optionally based on the amount of p-e cycles. Step 522 applies an erase voltage to the NAND strings being erased to charge up the bodies of the NAND strings.

Once the bodies are in a charged state, the voltages of word line layers are driven down. See, e.g., FIGS. 12A-12E for further details. Step 523 performs an erase-verify test. See, e.g., FIGS. 13A-13C for further details. If the memory cells pass the erase-verify test, the erase operation is done, at step 526. The memory cells may pass the erase-verify test when all, or almost all of the memory cells to be erased have a Vth below an erase-verify voltage, Vv_Er. This can be determined by applying Vv_Er to the word line layers and sensing the memory cells. If the memory cells are in a conductive state, their Vth is below Vv_Er. If the memory cells do not pass the erase-verify test at decision step 524, the erase operation is done, the erase voltage is incremented by the step size at step 526 and the stepped up erase voltage is applied at step 522.

Figure 5D:
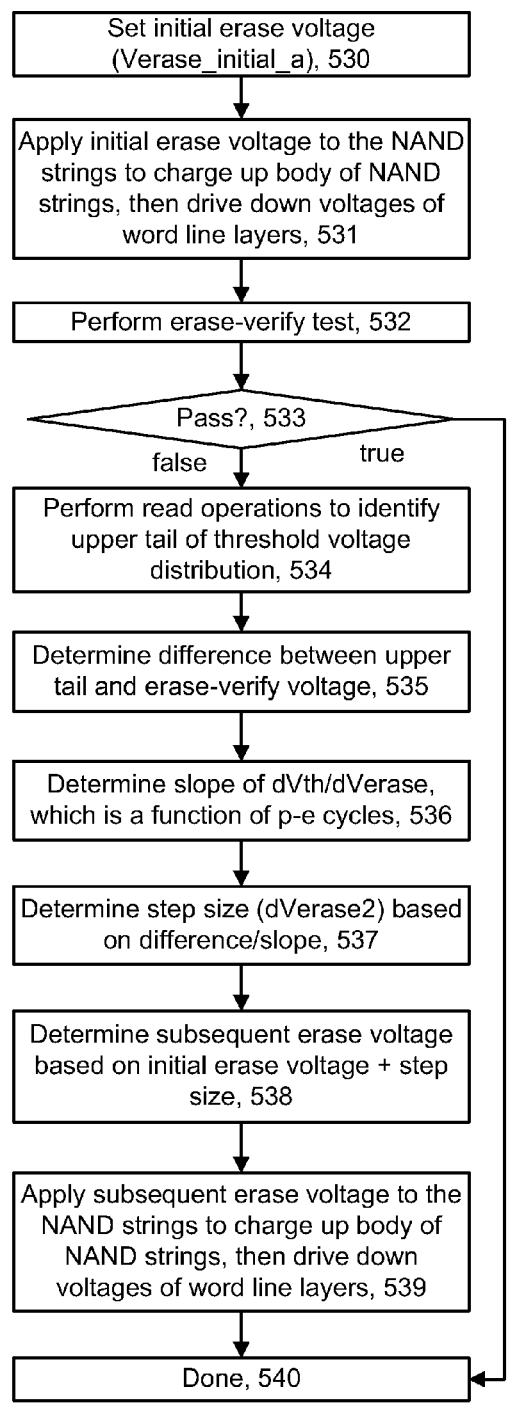
FIG. 5D depicts another example of an erase process according to step 504 of FIG. 5A, where the step size for a subsequent erase pulse is determined based on a threshold voltage distribution after an initial erase pulse.

FIG. 5D depicts another example of an erase process according to step 504 of FIG. 5A, where the step size for a subsequent erase pulse is determined based on a threshold voltage distribution after an initial erase pulse. Step 530 sets an initial erase voltage, Verase_initial_a. This can be a fixed value, for instance. Step 531 applies the initial erase voltage to the NAND strings to charge up the bodies of the NAND strings, then drives down the voltages of word line layers. This is an initial erase iteration.

Step 532 performs an erase-verify test. If the memory cells pass the erase-verify test, the erase operation is done, at step 540. If the memory cells do not pass the erase-verify test at decision step 533, step 534 performs one or more read operations to identify an upper tail of the threshold voltage distribution. See, e.g., FIGS. 10B and 10C for further details. The upper tail represents the Vth of memory cells which are furthest from the erase-verify level. These memory cells determine the magnitude of the second erase voltage. The further the upper tail is from the erase-verify level, the higher the second erase voltage should be. Step 535 determines a difference between the upper tail and Vv_Er. This is an example of a metric of the threshold voltage distribution. The metric indicates how far the upper tail is from the erase-verify level. The metric can be a difference between the upper tail and Vv_Er.

Step 536 determines the slope of dVth/dVerase, which is a function of p-e cycles, such as by reading the slope from a storage location. For example, the control can determine the slope by reading the plot of FIG. 14B using a count of p-e cycles, by reading the plot of FIG. 14C using a loop count, where dVth/dVerase decreases as loop count decreases, or by reading the plot of FIG. 14D using Vpgm_initial, where dVth/dVerase decreases as Vpgm_initial decreases. The slope, as a control parameter, represents an expected change in Vth with a change in Verase.

Step 537 determines the step size (dVerase2) based on difference/slope, the ratio of the difference to the slope. This involves modifying the difference between the upper tail and Vv_Er based on data which is indicative of the number of p-e cycles to provide a modified difference. The step size can be set equal to the modified difference. The modified difference is relatively higher when the amount of p-e cycles is relatively higher.

The step size is thus larger when the difference is larger and when the slope is smaller in magnitude. The slope is smaller in magnitude when the number of p-e cycles is higher, so the step size is larger when the number of p-e cycles is higher. Step 538 determines the subsequent (e.g., second) erase voltage (Verase2_a) based on the sum of the initial erase voltage and the step size, e.g., Verase2_a=Verase_initial_a+dVerase2. An additional margin could be added as well to further increase Verase2_a. This step thus involves determining a subsequent erase voltage based on a sum of the initial erase voltage and the modified difference.

Step 539 applies the subsequent erase voltage to the NAND strings to charge up their bodies, then drives down the voltages of word line layers. This is a subsequent erase iteration. The magnitude of the subsequent erase voltage is designed to be sufficient to complete the erase operation for all, or nearly all, of the memory cells. Recall that the subsequent erase voltage is based on an expected movement in Vth as a function of the erase voltage. By determining an erase voltage which is sufficient to move the Vth of the memory cells at the upper tail of the Vth distribution to the erase-verify level, the erase operation can be completed after the second erase voltage is applied. In one approach, it is assumed that the erase operation is completed without performing an erase-verify test after the second erase voltage is applied, and the erase operation is done at step 540.

FIG. 6A depicts a flowchart of an example programming operation in which Vpgm_initial is optimized, in accordance with step 516 of FIG. 5B. At step 600, a command to program data is received. For example, a host device may issue a command which is received by the control circuitry 110. Typically, a write command includes a unit of data such as a page data which is to be written (programmed). Step 601 programs the data to an initial set of memory cells at a word line layer in an initial set of NAND strings, such as a sub-block of NAND strings. This includes programming the fastest memory cells in the initial set of memory cells an initial amount. The programming starts with a program voltage of Vpgm_low. The initial set of memory cells is at least a subset of the selected memory cells in a programming or erase operation.

At step 602, based on the programming of step 601, a count of program loops which are needed to program the fastest memory cells in the initial set of memory cells the initial amount is determined. Step 603 stores the count of program loops as a loop count (LC). This is a minimum number of program loops needed to program the initial set of memory cells an initial amount. For example, the count can be stored in a byte of data in spare memory cells of the initial set of memory cells. This byte of data can be in a predetermined location of the initial set of memory cells so that the data can be read when programming a remaining set of memory cells and when performing an erase operation.

As an example, in FIG. 4, in the set of memory cells at WL3 in NS-SB0, the subset of memory cells can include M03 and M13. In the set of memory cells at WL3 in NS-SB1, the subset of memory cells can include M23 and M23. In the set of memory cells at WL3 in NS-SB2, the subset of memory cells can include M43 and M53. In the set of memory cells at WL3 in NS-SB3, the subset of memory cells can include M63 and M73. Similarly, in the set of memory cells at WL2 in NS-SB0, the subset of memory cells can include M02 and M12, and so forth.

Or, the count can be stored external to the memory array 126, such as in the storage location 113. Or, the count can be stored external to the memory die 108. The data register or the memory cells which store the loop count are storage locations. An advantage to storing the loop count in the nonvolatile memory cells of the memory array is that the loop count will not be lost if there is a power outage in the memory device or if the loop count is overwritten when programming another block. In contrast, a data register typically uses a volatile memory such as RAM in which data can be lost in a power outage. Another advantage to storing the loop count in the nonvolatile memory cells is that it is less expensive than RAM.

The count can be a number such as one, two, three . . . , which identifies a number of program loops used to program the fastest memory cells an initial amount. A reference program voltage (Vpgm_ref) is a level of Vpgm when the programming of the fastest memory cells has been programmed the initial amount. Vpgm_initial can be derived from Vpgm_ref. The data which is stored can therefor represent the count of program loops, Vpgm_ref or Vpgm_initial.

At step 604, a command to program additional data is received. Step 605 retrieves the count of program loops. For example, this can be done as part of an internal data load, which is done as a part of an upper page program sequence, right at the start of the sequence. At step 606, Vpgm_initial is set based on the count of program loops (LC). This is a respective starting voltage for a remaining set of memory cells. One approach, at step 608, is to set Vpgm_initial=Vpgm_ref−(VvINT−VvA). For example, assume VvINT=1.0 V, VvA=0.5 V and Vpgm_ref=17 V. Then, Vpgm_initial=17−(1.0−0.5)=16.5 V. Another approach, at step 609, is to set Vpgm_initial=(Vpgm_low+LC×dVpgm_high)−(VvINT−VvA). For example, assume Vpgm_low=14 V, LC=3, dVpgm_high=1.0 V, VvINT=1.0 V and VvA=0.5 V. Then, Vpgm_initial=(14+3×1.0)−(1.0−0.5)=16.5 V. Optionally, in a conservative approach, a further offset, such as 0.5-1.0 V can be applied to further reduce Vpgm_initial. This ensures that the first program pulse at the level of Vpgm_initial does not result in over-programming of the remaining set of memory cells.

The state machine can store data which identifies Vpgm_low, dVpgm_high, VvA and VvINT. In one approach, the state machine reads the value Vpgm_ref from the memory cells or the data register and performs the calculation of step 608. In another approach, the state machine read the value LC from the memory cells or the data register and performs the calculation of step 609.

dVpgm_high is a relatively high step size which can be used in programming a lower page of data, where reduced accuracy is acceptable as a tradeoff for faster programming A relatively low step size, dVpgm_low, can be used in programming an upper page of data, where increased accuracy is more important.

Step 607 programs remaining sets of memory cells at the word line layer using Vpgm_initial. Efficiencies are achieved because Vpgm_initial is determined once from the initial set of memory cells and used multiple times—once for each of the remaining sets of memory cells. The time used in the lower page programming may be increased slightly due to the use of a relatively low initial Vpgm, Vpgm_low. However, the time used in programming each of the remaining sets of memory cells is minimized because Vpgm_initial is customized to the programming speed of the remaining sets of memory cells, which is considered to be the same as the programming speed of the initial set of memory cells. That is, Vpgm_initial can be set to the highest possible level which avoids over-programming while minimizing the number of program loops and therefore minimizing programming time.

Another, less efficient, approach is to determine Vpgm_initial separately during lower page programming of each set of memory cells, and to use Vpgm_initial for the upper page programming of each set of memory cells. However, this is not possible when single-pass programming is used. The approach of FIG. 6A is especially advantageous since single-pass programming is expected to be commonly used with 3D stacked non-volatile memory devices.

FIG. 6B depicts an example process for carrying out the programming operation of FIG. 6A when programming lower and upper pages of data. In this approach, step 610 programs a lower page of data to the initial set of memory cells in a first programming pass. These are selected memory cells. See FIGS. 8A and 8B. Step 611 programs an upper page of data to the initial set of memory cells in a second programming pass. See FIG. 8C. Step 612 programs lower and upper pages of data (e.g., multiple pages of data) to remaining sets of memory cells in a single programming pass. See FIGS. 7A and 7B.

Figure 6C:
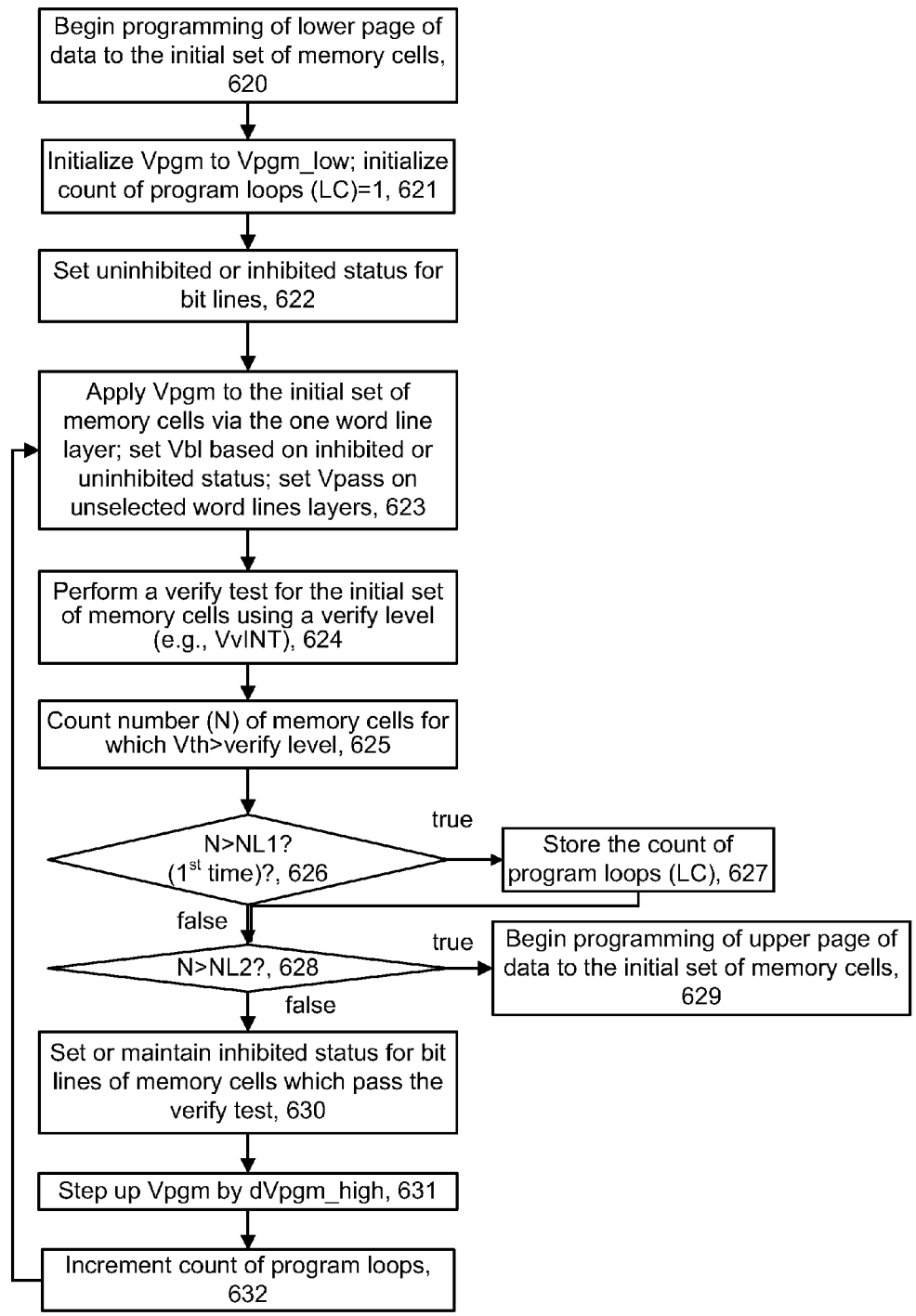
FIG. 6C depicts an example process in accordance with step 610 of FIG. 6B, in which a lower page of data is programmed to an initial set of memory cells and a program loop count is determined, in a first programming pass.

FIG. 6C depicts an example process in accordance with step 610 of FIG. 6B, in which a lower page of data is programmed to an initial set of memory cells and a program loop count is determined, in a first programming pass. Step 620 begins programming of a lower page of data to the initial set of memory cells. Step 621 initializes Vpgm to a relatively low level, Vpgm_low. This step also initializes a count of program loops=1. Vpgm_low can be low enough so that, when the initial amount of programming is completed, the memory cells are mostly already in a steady state, where the Vth of the memory cells increases consistently and predictably with the increase in Vpgm. For instance, Vpgm_low may be low enough so that two or three program loops are used to complete the initial amount of programming, even for a memory device with many p-e cycles. Step 622 sets an uninhibited or inhibited status for the bit lines. For example, a bit line associated with a NAND string in which a memory cell is to remain in an erased state will have an inhibited status. A bit line associated with a NAND string in which a memory cell is to be programmed to a higher data state will have an uninhibited status, until the memory cell reaches the higher data state, at which time the status is changed to inhibited.

Step 623 applies Vpgm to the initial set of memory cells via the one word line layer, while setting Vbl based on the inhibited or uninhibited status of each bit line, and setting Vpass on unselected word lines layers. Step 624 performs a verify test for the initial set of memory cells using a verify level (e.g., VvINT). It is efficient to use the verify level of a target data state (e.g., INT) to determine the initial amount of programming since an extra verify operation is avoided. However, it is possible to use a verify level to determine the initial amount of programming which is different than a verify level of a target data state.

Decision step 625 counts a number N of memory cells for which Vth exceeds the verify level. Decision step 626 determines if N>NL1 for the first time, where NL1 is a specified number of memory cells. If decision step 626 is true, step 627 stores the current value of the count of program loops (LC) and step 629 follows. If decision step 626 is false, decision step 628 determines if N>NL2, where NL2 is a specified number and NL2>NL1. For example, NL1 can represent a small fraction (e.g., 6%) of all memory cells being programmed, and NL2 can represent a large fraction (e.g., 95%) of all memory cells being programmed.

If decision step 628 is true, the programming of the lower page of data to the initial set of memory cells is completed, and step 629 begins programming of an upper page of data to the initial set of memory cells. See FIG. 6D. If decision step 628 is false, step 630 sets or maintains an inhibited status for bit lines of memory cells which pass the verify test. Step 631 steps up Vpgm by dVpgm_high, step 632 increments the count of program loops and a next program pulse is applied at step 623.

Generally, in a programming pass, the number of program loops can be limited to a maximum allowable number.

Figure 6D:
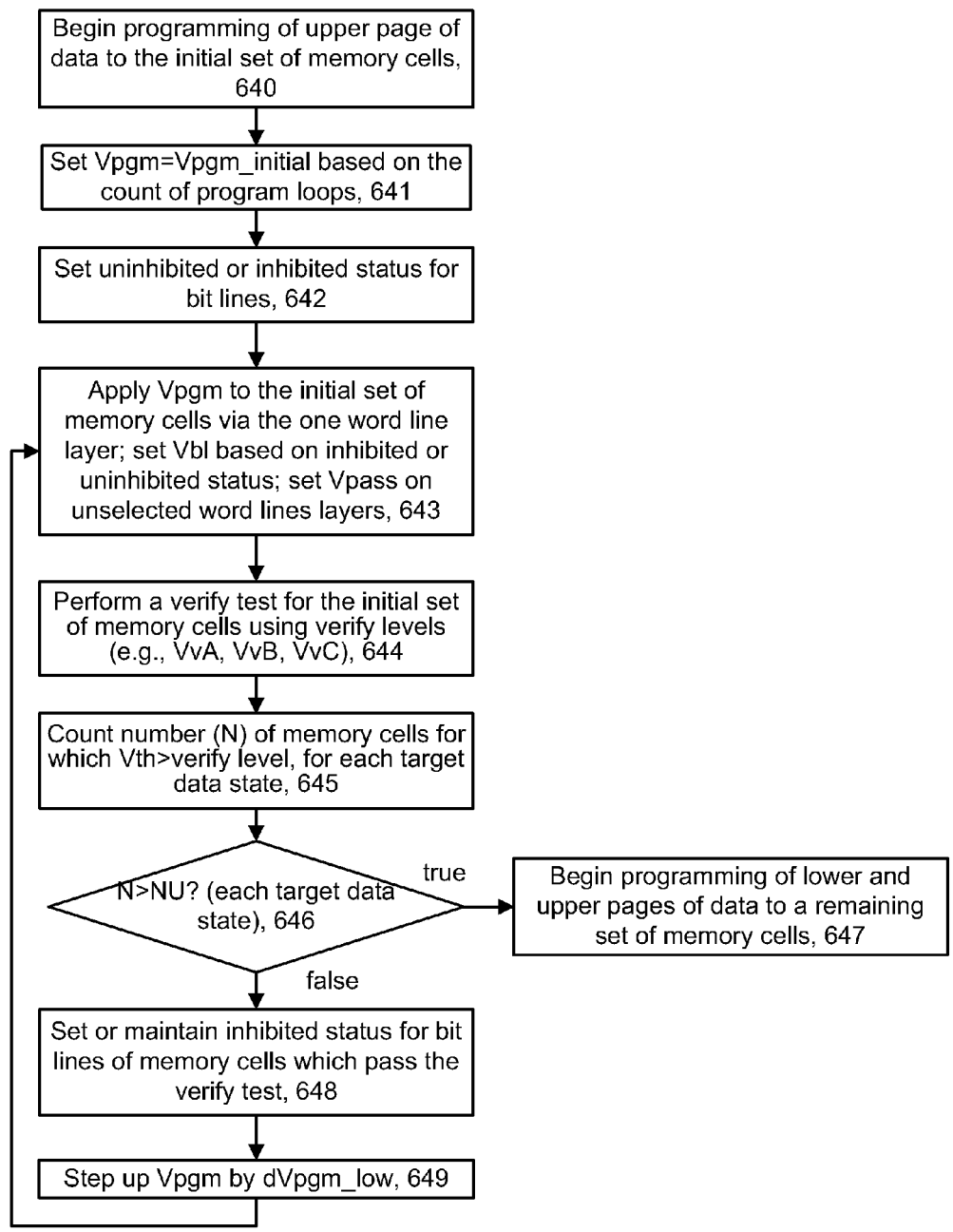
FIG. 6D depicts an example process in accordance with step 629 of FIG. 6C, in which an upper page of data is programmed to the initial set of memory cells using Vpgm_initial which is based on the program loop count, in a second programming pass.

FIG. 6D depicts an example process in accordance with step 629 of FIG. 6C, in which an upper page of data is programmed to the initial set of memory cells using Vpgm_initial which is based on the program loop count, in a second programming pass. In this case, the programming of the upper page of data is optimized based on results from programming the lower page of data.

When the host issues a write command and sends upper page bits to the memory device, the control circuitry of the memory can read the lower page bit which has just been programmed into each memory cell and store the bits in latches associated with the bit lines. The upper page bit is sent to additional latches associated with the bit lines. At this time, the target data state of each memory cell can be determined from the combination of the lower page bit and the upper page bit in the latches. Further, in response to the write command for the upper page, the control circuitry can read the loop count data and determine Vpgm_initial. At this point, the programming of the upper page can begin.

Step 640 begins programming of the upper page of data to the initial set of memory cells. Step 641 sets Vpgm=Vpgm_initial based on the count of program loops, such as discussed in connection with steps 608 and 609 of FIG. 6A. Step 642 set an uninhibited or inhibited status for the bit lines. Step 643 applies Vpgm to the initial set of memory cells via the one word line layer, sets Vbl based on the inhibited or uninhibited status, and sets Vpass on the unselected word lines layers. Step 644 performs a verify test for the initial set of memory cells using verify levels (e.g., VvA, VvB, VvC in FIG. 8B). The verify test can use one or more verify levels for each target data state. One approach uses lower and higher verify levels for each target data state.

Step 645 counts a number (N) of memory cells for which Vth>verify level, for each target data state. Decision step 646 determines if N>NU for each target data state. If decision step 646 is true, step 647 begins programming of lower and upper pages of data to a remaining set of memory cells. See FIG. 6E. If decision step 646 is false, step 648 sets or maintains an inhibited status for bit lines of the memory cells which pass the verify test. Step 649 steps up Vpgm by dVpgm_low, and a next program pulse is applied at step 643.

Figure 6E:
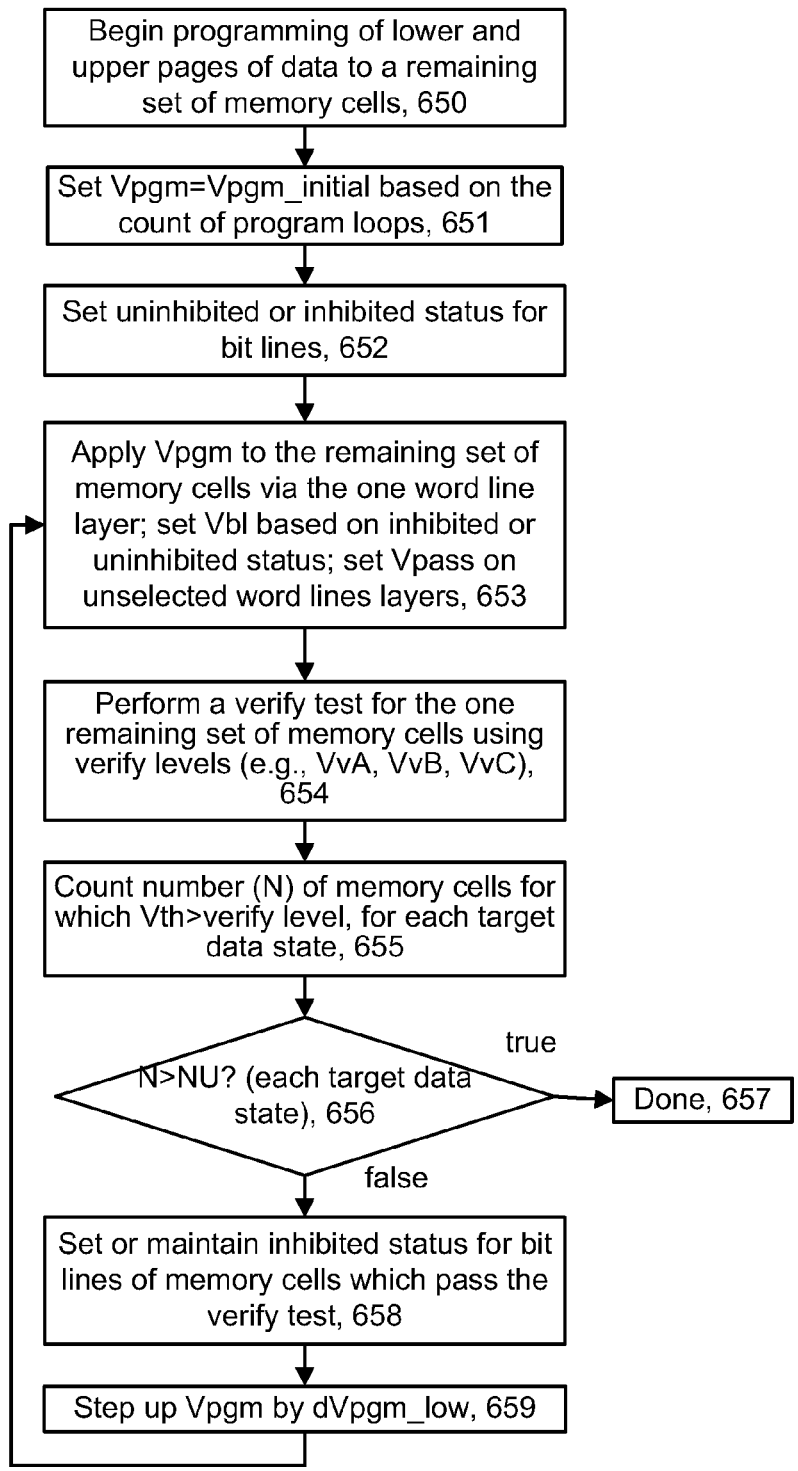
FIG. 6E depicts an example process in accordance with step 612 of FIG. 6B, in which lower and upper pages of data are programmed to a remaining set of memory cells using Vpgm_initial which is based on the program loop count, in a single programming pass.

FIG. 6E depicts an example process in accordance with step 612 of FIG. 6B, in which lower and upper pages of data are programmed to a remaining set of memory cells using Vpgm_initial which is based on the program loop count, in a single programming pass. Step 650 begins programming of lower and upper pages of data to a remaining set of memory cells. In general, there will be many remaining sets of selected memory cells after the initial set of memory cells is programmed Step 651 sets Vpgm=Vpgm_initial based on the count of program loops. Step 652 set an uninhibited or inhibited status for the bit lines. Step 653 applies Vpgm to the initial set of selected memory cells via the one word line layer, sets Vbl based on the inhibited or uninhibited status, and sets Vpass on the unselected word lines layers. Step 654 performs a verify test for the remaining set of memory cells using verify levels (e.g., VvA, VvB, VvC in FIG. 8B).

Step 655 counts a number (N) of memory cells for which Vth>verify level, for each target data state. Decision step 656 determines if N>NU for each target data state. If decision step 656 is true, the programming is done at step 657. If decision step 656 is false, step 658 sets or maintains an inhibited status for bit lines of the memory cells which pass the verify test. Step 659 steps up Vpgm by dVpgm_low, and a next program pulse is applied at step 653.

Figure 7A:
FIGS. 7A and 7B depict a one pass programming operation with four data states.
Figure 7B:
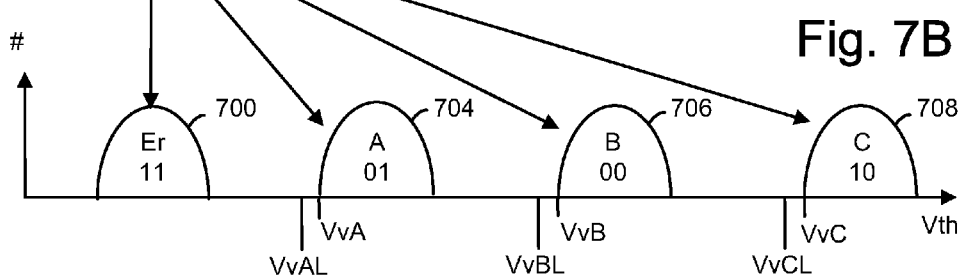

FIGS. 7A and 7B depict a one pass programming operation with four data states. One pass programming is also referred to as "one-pass write" programming which involves a sequence of multiple program-verify operations which are performed starting from Vpgm_initial and proceeding to a final Vpgm level until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 700 is provided for erased (Er) state memory cells. Three Vth distributions 704, 706 and 708 represent target data states A, B and C, respectively, which are reached by memory cells when their Vth exceeds the nominal (higher) verify level VvA, VvB or VvC, respectively. In this case, each memory cell can store two bits of data in one of four possible Vth ranges, referred to as states Er (or E), A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvAL, VvBL or VvCL) are defined such that the memory cells enter a slow programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a memory cell exceeds the lower verify level associated with the target data state of the memory cell, a slow programming mode begins for the memory cell. Subsequently, when a verify test determines that the Vth of a memory cell exceeds the higher verify level associated with the target data state of the memory cell, the memory cell is inhibited from further programming. In some cases, QPW is used on fewer than all target data states.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the Er, A, B and C states. Read reference voltages which are between the distributions are used for reading data from the memory cells. By testing whether the Vth of a given memory cell is above or below one or more of the read reference voltages, the system can determine the data state which is represented by a memory cell.

Figure 8A:
FIGS. 8A to 8C depict a two pass programming operation with four data states.
Figure 8B:
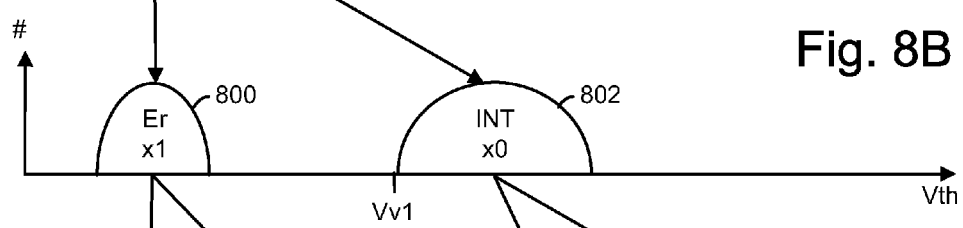
Figure 8C:
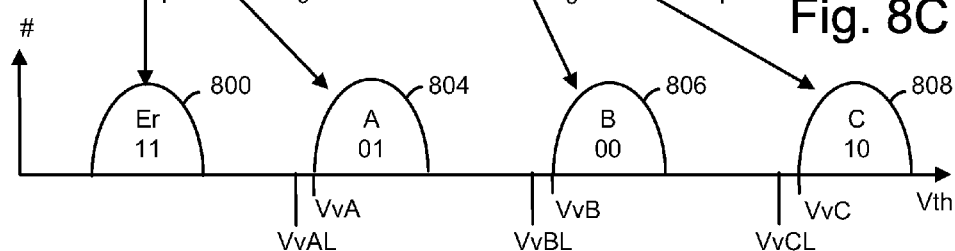

FIGS. 8A to 8C depict a two pass programming operation with four data states. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 800 in FIG. 8A.

FIG. 8B depicts programming of a lower page of data. If the lower page has a bit=1, the associated memory cell remains in the distribution 800 and the data is represented by x1, where x is an upper page bit that is not yet known. If the lower page has a bit=0, the memory cell is programmed to a higher Vth as represented by distribution 802, which is an interim distribution (INT), using a verify level Vv1. The data of these memory cells is represented by x0. Note that the interim distribution can be relatively wide since it is not a final distribution and does not represent a final data state.

FIG. 8C depicts programming of an upper page of data. If UP/LP=11, the associated memory cell in the distribution 800 remains in the distribution 800 and stores data bits 11. If UP/LP=01, the memory cells in the distribution 800 are programmed to the distribution 804 (state A) and a slow programming mode is used when the Vth is between VvAL and VvA. If UP/LP=10, the memory cells in the distribution 802 are programmed to the distribution 808 (state C) and a slow programming mode is used when the Vth is between VvCL and VvC. If UP/LP=00, the memory cells in the distribution 802 are programmed to the distribution 806 (state B) and a slow programming mode is used when the Vth is between VvBL and VvB.

Programming can be similarly extended to three or more bits per memory cell.

Figure 8D:
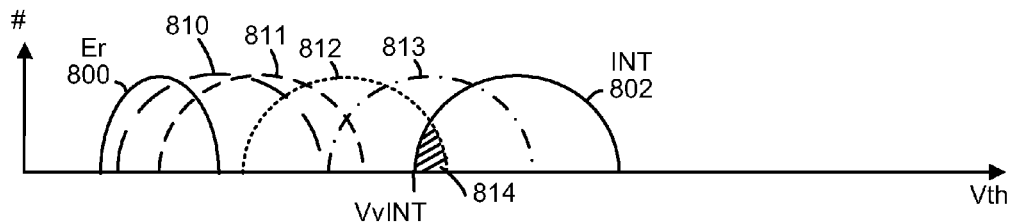
FIG. 8D depicts a process for determining a count of program loops needed to program the fastest memory cells in an initial set of memory cells an initial amount, in accordance with step 602 of FIG. 6A and with the transition from FIG. 8A to 8B.

FIG. 8D depicts a process for determining a count of program loops needed to program the fastest memory cells in an initial set of memory cells an initial amount, in accordance with step 602 of FIG. 6A and with the transition from FIG. 8A to 8B. The Vth distribution 800 is the initial distribution of all memory cells after an erase operation. The Vth distributions 810, 811, 812, 813 and 802 occur after one, two, three, four and five program-verify iterations (loops), respectively. In the Vth distribution 812, a portion 814 of the distribution exceeds VvINT. This can represent the completion of an initial amount of programming. For example, this can represents the case where N>NL1 in decision step 626 of FIG. 6C. The programming pass is completed when the Vth distribution 802 is reached after the fifth program-verify iteration. As a result, loop count=five.

Figure 9A:
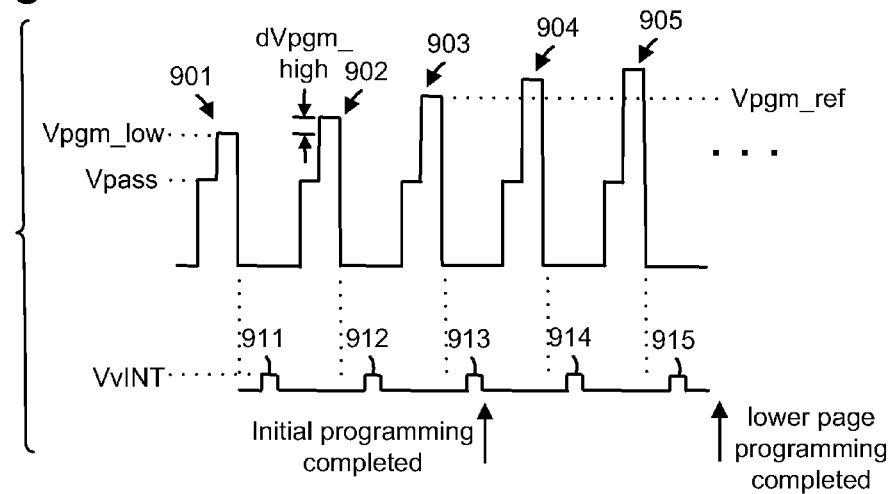
FIG. 9A depicts program and verify voltages for programming a lower page of data in an initial set of memory cells in accordance with FIG. 6C, where a relatively low initial Vpgm, Vpgm_low, and a relatively high Vpgm step size, dVpgm_high, are used.

FIG. 9A depicts program and verify voltages for programming a lower page of data in an initial set of memory cells in accordance with FIG. 6C, where a relatively low initial Vpgm, Vpgm_low, and a relatively high Vpgm step size, dVpgm_high, are used. A programming operation may include multiple program-verify iterations, where each program-verify iteration includes a programming portion comprising a program pulse and a following verify operation comprising one or more verify voltages. The program pulse and verify voltages can be applied to a selected word line layer portion, for instance.

In one approach, the program pulses are stepped up in successive iterations. Moreover, each program pulse may include a first portion which has a pass voltage (Vpass) level, e.g., 6-8 V, followed by a second, peak amplitude portion at a program level, e.g., 12-25V. For example, this programming pass includes program pulses 901-905 and associated verify pulses 911-915, respectively. In this example, the initial amount of programming is completed after the verify pulse 913 in the third program loop, so that the loop count=3. A program voltage of Vpgm_ref is applied in the third program loop. The lower page programming is completed after the verify pulse 915 in the fifth program loop.

Figure 9B:
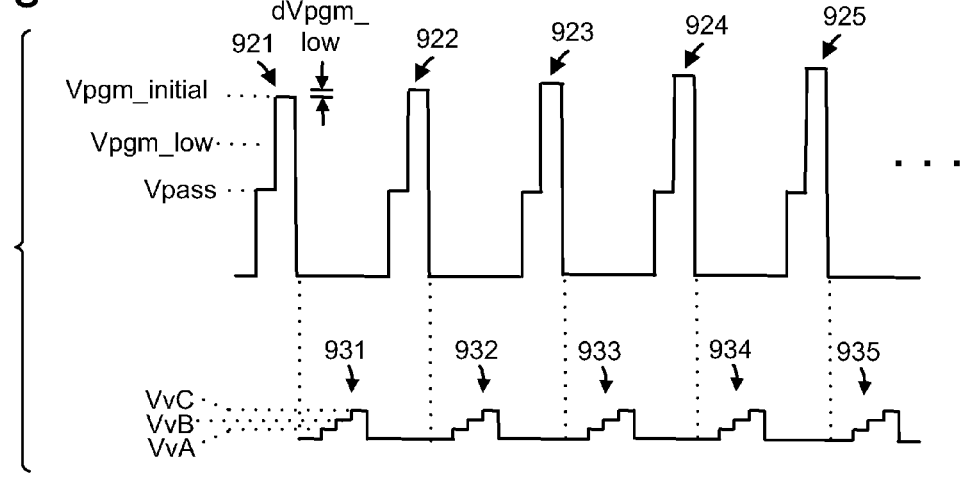
FIG. 9B depicts program and verify voltages for programming an upper page of data in a second programming pass in accordance with FIG. 6D, or for programming lower and upper pages of data concurrently in a single programming pass in accordance with FIG. 6E, where Vpgm_initial is based on a program loop count and a relatively low Vpgm step size, dVpgm_low, is used.

FIG. 9B depicts program and verify voltages for programming an upper page of data in a second programming pass in accordance with FIG. 6D, or for programming lower and upper pages of data concurrently in a single programming pass in accordance with FIG. 6E, where Vpgm_initial is based on a program loop count and a relatively low Vpgm step size, dVpgm_low, is used. For example, this programming pass includes program pulses 921-925 and associated verify voltages 931-935, respectively. Each verify voltage comprises three levels: VvA, VvB and VvC. In this example, several program loops are used and the completion of the programming is not shown.

Figure 9C:
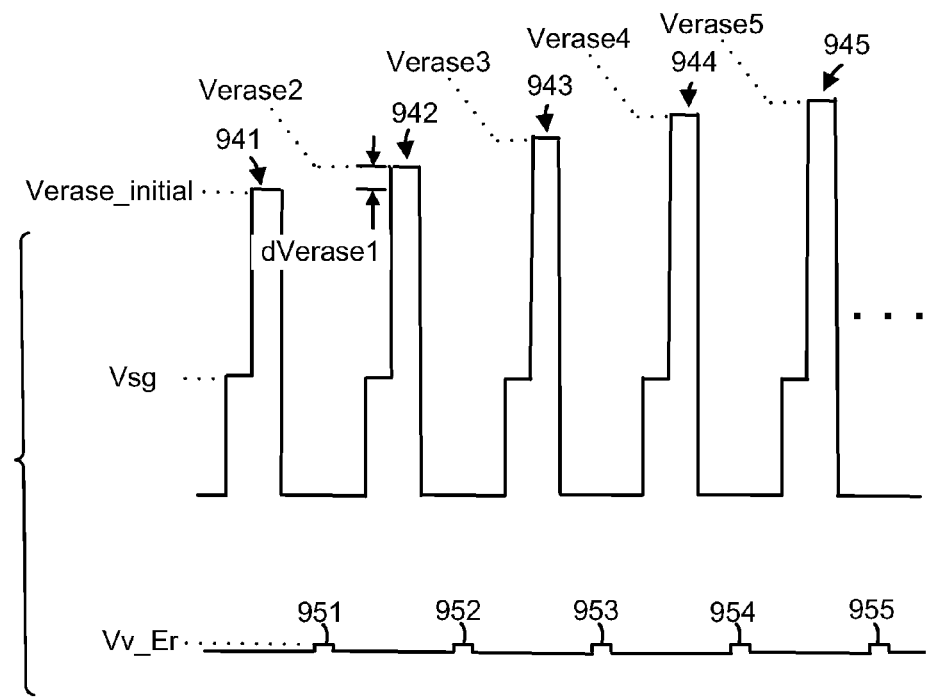
FIG. 9C depicts a series of erase pulses and verify pulses in an erase operation in accordance with FIG. 5C.
Figure 9D:
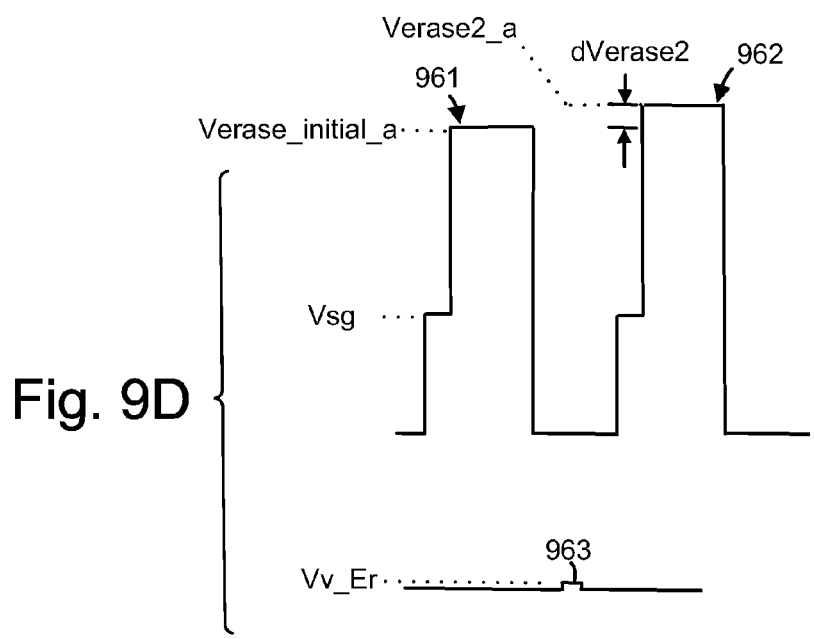
FIG. 9D depicts a series of erase pulses and a verify pulse in an erase operation in accordance with FIG. 5D.

FIG. 9C depicts a series of erase pulses 941-945 and verify pulses 951-955 in an erase operation in accordance with FIG. 5C. This type of erase operation is meant to include a few erase pulses, where the erase process occurs incrementally after each erase pulse. In contrast, the erase operation of FIG. 9D is meant to be completed after two erase pulses, although additional pulses can optionally be used. Accordingly, the magnitude and/or duration of the erase pulses may be smaller in FIG. 9C than in FIG. 9D.

The erase pulses are applied to one or both ends of the NAND strings and the verify pulses are applied to the control gates of the memory cells via the word line layers. An erase operation can include multiple erase-verify iterations. Each erase-verify iteration can include an erase portion followed by a verify portion. Example verify pulse 951 having an amplitude of Vv_Er follows erase pulse 452. In the erase portion, an erase pulse or voltage is applied to one or both ends of a NAND string. Each erase portion can have a first portion of amplitude Vsg which is applied in a preparation phase, and a second portion of amplitude Verase which is applied in charge up and erase phases, as discussed further below. Verase_initial is the amplitude of the initial erase pulse 941. Erase pulses 942, 943, 944 and 945 have amplitudes of Verase2, Verase3, Verase4 and Verase5, respectively. The erase pulses increase according to a step size of dVerase1. Verase2 may represent a subsequent erase voltage and Verase3, Verase4 and Verase5 may represent at least one additional erase voltage.

The erase pulses can thus step up in amplitude in each iteration, in one approach. In the verify portion, a determination is made as to whether the Vth of the selected memory cells which are to be erased have fallen below Vv_Er. This can include determining whether the selected memory cells are in a conductive state when a word line voltage of Vv_Er is applied to the selected memory cells. If the selected memory cells are in a conductive state, Vth<Vv_Er and the selected memory cells have been fully erased. If the selected memory cells are in a non-conductive state, Vth>Vv_Er and the selected memory cells have not yet been fully erased.

FIG. 9D depicts a series of erase pulses 961 and 962 and a verify pulse 963 in an erase operation in accordance with FIG. 5D. Verase_initial_a is the amplitude of the initial (first) erase pulse and Verase2 is the amplitude of the subsequent (second) erase pulse. The step size is dVerase2. As an example, the pulse widths are larger than in FIG. 9C since a goal is to complete the erase operation with two erase pulses. In one approach, no verify pulse is applied after the second erase pulse since the erase operation is assumed to have been successfully completed. Optionally, an additional verify pulse can be applied followed by at least one additional erase voltage, if necessary to complete the erase operation.

Figure 10A:
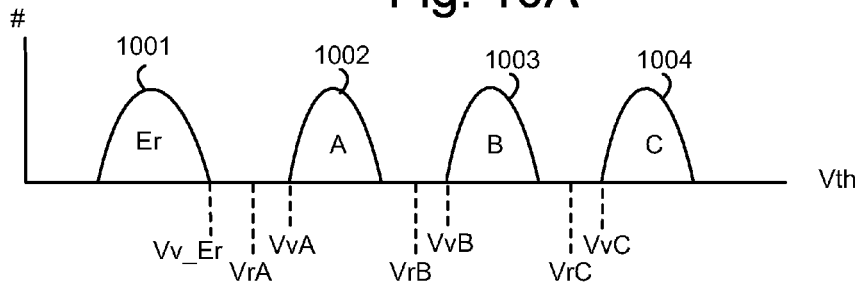
FIG. 10A depicts a threshold voltage (Vth) distribution with four data states, showing read voltages and verify voltages.

FIG. 10A depicts a threshold voltage (Vth) distribution with four data states, showing read voltages and verify voltages. The distributions 1001, 1002, 1003 and 1004 represent the erased (Er) state, the A state, the B state and the C state, respectively. The verify levels are Vv_Er, VvA, VvB and VvC. The read levels are VrA, VrB and VrC. This is a distribution which is reached after programming a set of memory cells.

Figure 10B:
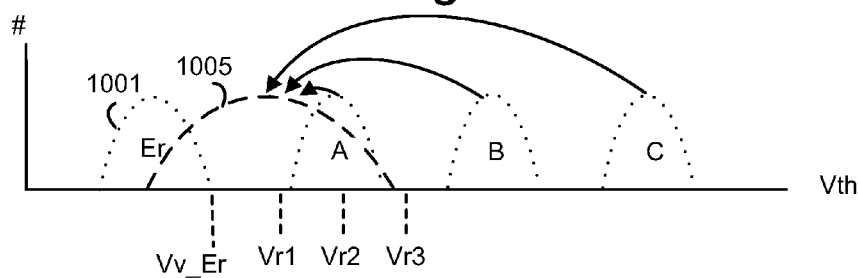
FIG. 10B-10D depict changes in the Vth distribution of FIG. 10A during an erase operation according to FIG. 5D.
Figure 10C:
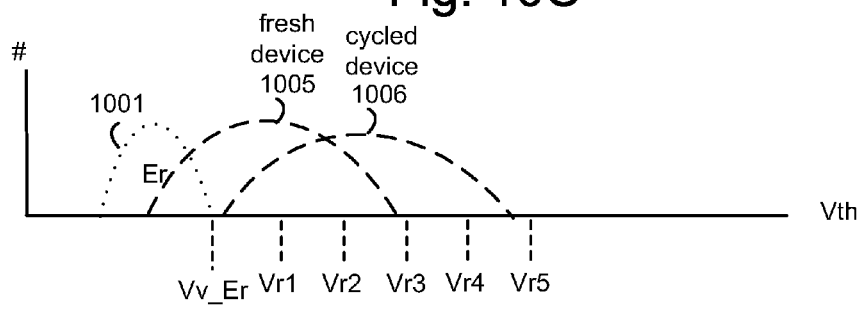
Figure 10D:
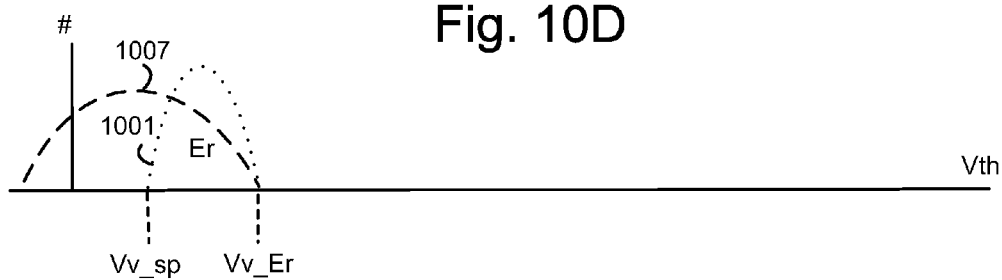

FIG. 10B-10D depict changes in the Vth distribution of FIG. 10A during an erase operation according to FIG. 5D. In this case, the erase operation is intended to be completed after two erase pulses.

In FIG. 10B, after an initial erase pulse is applied, the Vth distribution 1005 represents the A, B and C states. The Vth distribution is relatively wide. Some memory cells may have a Vth which is below Vv_Er while others have a Vth which is above Vv_Er. To adaptively determine an optimal magnitude of the subsequent erase pulse, the distance between the Vth of the slowest erasing memory cells and Vv_Er is considered. To do, this, one or more read operations can be performed using read compare levels such as Vr1, Vr2 and Vr3 which are applied to the word line layers. A goal is to identify an upper tail of the Vth distribution 1005. When a read is performed using Vr2, it is concluded that many memory cells have a Vth>Vr2. However, when a read is performed using Vr3, it is concluded that no, or few, memory cells have a Vth>Vr3. Accordingly, the upper tail is between these two read levels. As an example, Vr3 can represent the upper tail, and the distance between the upper tail and Vv_Er is Vr3-Vv_Er. The optimal magnitude of the subsequent erase pulse can then be determined based on the slope dVth/dVerase and Vr3-Vv_Er, as discussed.

In one approach, the read voltages can start at a relatively low level and increase incrementally until the upper tail is distinguished. In another approach, the read voltages can start at a level which is believed to be close to the upper tail. Then, based on each read result, the next read level can be adjusted dynamically higher or lower.

FIG. 10C represents a Vth distribution 1005 for a fresh memory device and a Vth distribution 1006 for a cycled memory device. For the cycled memory device, the Vth is not as deep as for the fresh memory device. Accordingly, the upper tail of the cycled memory device is higher than for the fresh memory device. In this case, additional read operations are performed using Vr4 and Vr5 to determine that Vr5 should represent the upper tail.

FIG. 10D represents a Vth distribution 1007 for the fresh memory device after a subsequent erase pulse is applied. In this case, due to the optimal magnitude of the subsequent erase pulse, substantially all of the memory cells have a Vth below Vv_Er. A soft programming process may optionally be performed to increase the Vth of the most deeply erase memory cells using a verify level of Vv_sp, resulting in the Vth distribution 1001.

FIG. 11A-11E depict changes in the Vth distribution of FIG. 10A during an erase operation according to FIG. 5C. As mentioned, this process typically involves multiple erase-verify iterations in which the Vth is incrementally reduced.

Figure 11A:
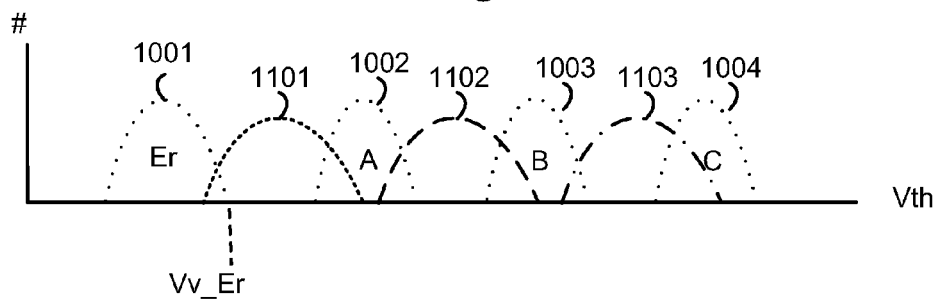
FIG. 11A-11E depict changes in the Vth distribution of FIG. 10A during an erase operation according to FIG. 5C.

FIG. 11A depicts Vth distributions 1101, 1102 and 1103 for the A, B and C state memory cells, respectively, after a first erase pulse.

Figure 11B:
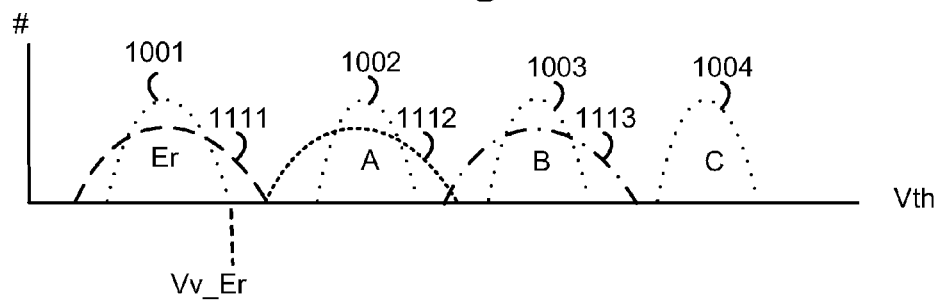

FIG. 11B depicts Vth distributions 1111, 1112 and 1113 for the A, B and C state memory cells, respectively, after a second erase pulse.

Figure 11C:
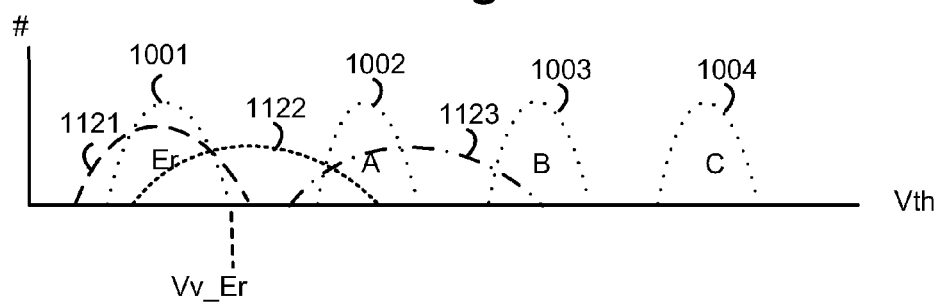

FIG. 11C depicts Vth distributions 1121, 1122 and 1123 for the A, B and C state memory cells, respectively, after a third erase pulse.

Figure 11D:
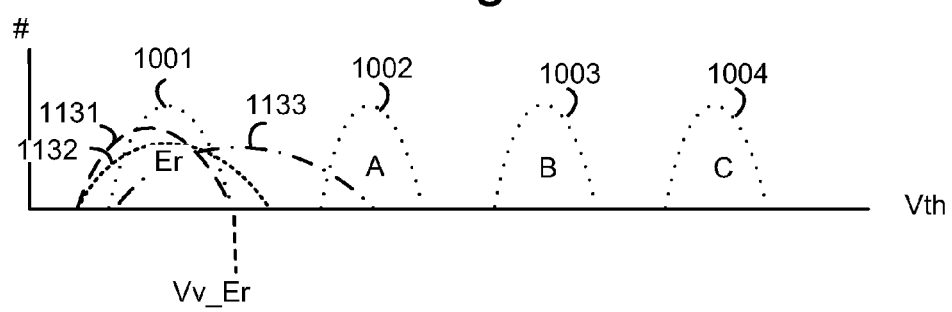

FIG. 11D depicts Vth distributions 1131, 1132 and 1133 for the A, B and C state memory cells, respectively, after a fourth erase pulse.

Figure 11E:
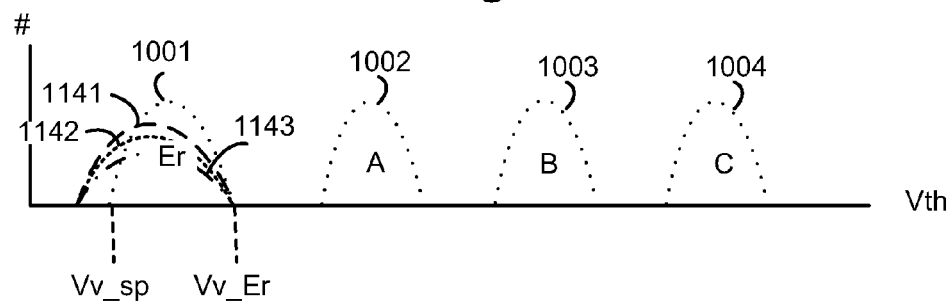
Figures 12A, 12B, 12C, 12D, 12E:
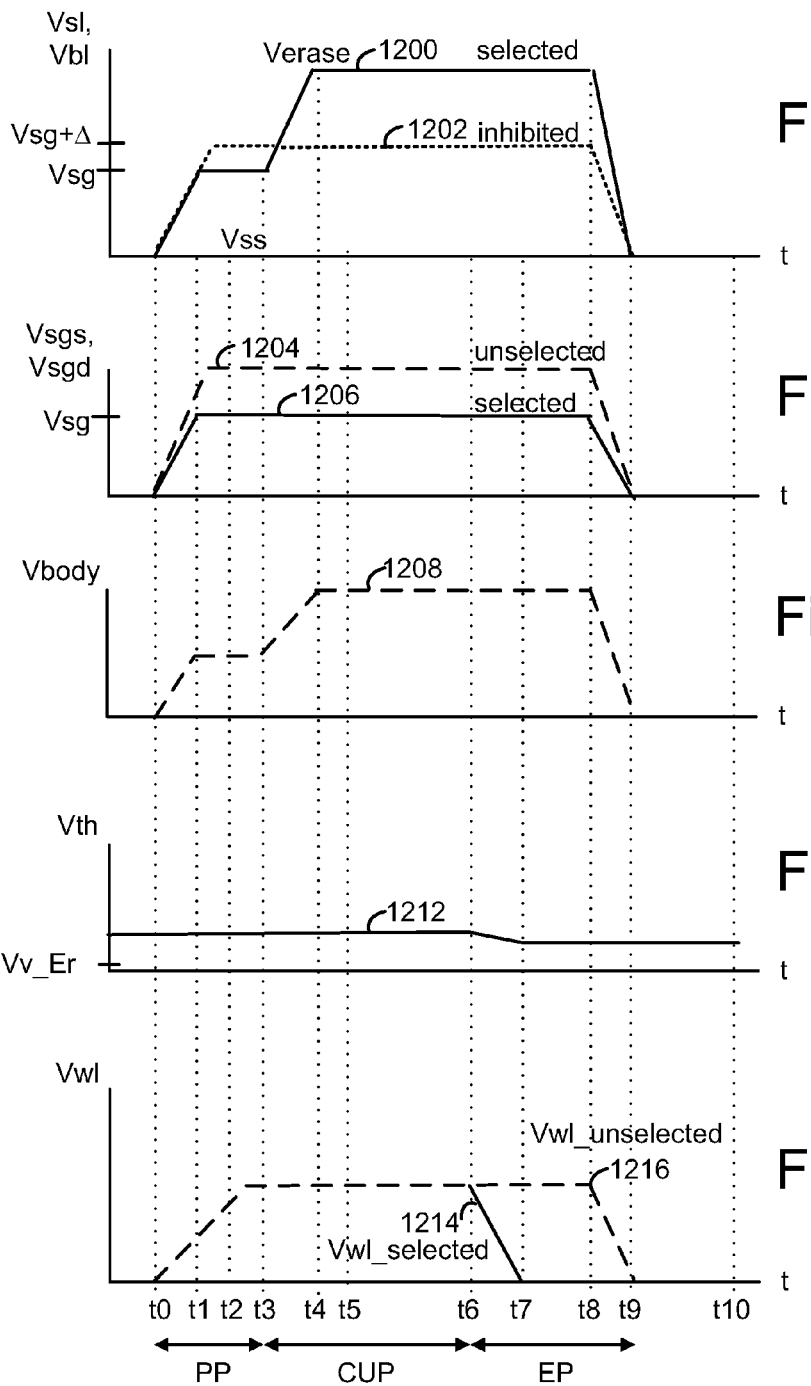
FIGS. 12A-12E depict voltages in the erase portion of an erase-verify iteration of an erase operation, consistent with FIGS. 9C and 9D.

FIG. 11E depicts Vth distributions 1141, 1142 and 1143 for the A, B and C state memory cells, respectively, after a fifth and final erase pulse. Finally, the Vth distribution 1001 is obtained after soft programming.

FIGS. 12A-12E depict voltages in the erase portion of an erase-verify iteration of an erase operation, consistent with FIGS. 9C and 9D. Different plots are provided showing changes in voltage on vertical axes versus time on the horizontal axis. The plots are time-aligned but not necessarily to scale. For generality, an entire block or a partial block can be erased. A partial block can include one or more sub-blocks (each sub-block comprising a set of NAND strings) and one or more word line layers. The term "selected" is used to denote memory cells being erased and associated sub-blocks, NAND strings or word line layers. Similarly, the term "unselected" is used to denote memory cells not being erased and associated sub-blocks, NAND strings or word line layers.

Further, an erase operation can be one-sided (where Verase is applied to the drain ends of the NAND strings via the bit line) or two-sided (where Verase is also applied to the source ends of the NAND strings via the source line).

An erase operation can include three phases: a preparation phase (PP), a charge up phase (CUP) and an erase phase (EP). The preparation phase, in the time interval t0-t3, sets voltages as follows: Vbl (selected sets of NAND strings): raise from Vss to Vsg (waveform 1200); Vsl (common to all NAND strings in a block): raise from Vss to Vsg (waveform 1200); Vsgs (selected sub-block): raise from Vss to Vsg (waveform 1206); Vsgs (unselected sub-block): float (waveform 1204); Vsgd (selected sub-block): raise from Vss to Vsg (waveform 1206); Vsgd (unselected sub-block): float (waveform 1204); Selected word lines: float (waveform 1214); and unselected word lines: float (waveform 1216). If all NAND strings in the block are selected to be erased, there will be no inhibited NAND strings during the two-sided erase.

A selected sub-block is a sub-block with one or more selected NAND strings, and an unselected sub-block is a sub-block with all unselected NAND strings.

A long-dash line represents a floating voltage in FIGS. 12A-12C and 12E, while a solid or short-dash line represents a driven voltage.

The charge up phase (CUP), in the time interval t3-t6, sets voltages as follows: Vbl (selected sets of NAND strings): raise to Verase (waveform 1200); Vsl: raise to Verase (waveform 1200); Vsgs (selected sub-block): Vsg (waveform 1206); Vsgs (unselected sub-block): float (waveform 1204); Vsgd (selected sub-block): Vsg (waveform 1206); Vsgd (unselected sub-block): float (waveform 1204); Selected word lines: float (waveform 1214); and unselected word lines: float (waveform 1216).

The erase phase (EP), in time interval t6-t9, sets voltages as follows: Vbl (selected sets of NAND strings): Verase (waveform 1200); Vsl: Verase (waveform 1200); Vsgs (selected sub-block): Vsg (waveform 1206); Vsgs (unselected sub-block): float (waveform 1204); Vsgd (selected sub-block): Vsg (waveform 1206); Vsgd (unselected sub-block): float (waveform 1204); Selected word lines: drive down to 0 V (waveform 1214); and unselected word lines: float (waveform 1216).

Vsgs is the source-side select gate voltage and Vsgd is the drain-side select gate voltage.

For example, Vsg can be about 5-15 V and Verase can be about 15-25 V. In the preparation phase, if Vsl is roughly equal to Vsgs, essentially no GIDL will be generated from the SGS transistor. Vsl would need to exceed Vsgs by a substantial margin such as several Volts, e.g., at least about 4-6 V, in order to generate GIDL from the SGS transistor. Similarly, since Vbl roughly equals Vsgd, essentially no GIDL will be generated from the SGD transistor. Vbl would need to exceed Vsgd by a substantial margin to generate GIDL from the SGD transistor.

Vbody (waveform 1208 in FIG. 12C) denotes a potential of the body of the selected NAND string, e.g., the polysilicon body. The body is quickly charged up to an initial level in the preparation phase. A higher level of GIDL is generated in the charge up phase, and the body is charged-up to a higher level. For an unselected NAND string, Vbody is not charged up as much and may be between about 0 V and the initial level for the selected NAND strings.

Vth (waveform 1212 in FIG. 12D) is the threshold voltage of a selected memory cell. It is at some non-zero level, e.g., above 0 V, perhaps 1-6 V, in the A, B or C state. Vwl_selected (waveform 1214 in FIG. 12E) is the voltage of a selected word line (e.g., word line layer or portion) which is in communication with one or more selected memory cells to be erased. Vwl_unselected (waveform 1216 in FIG. 12E) is the voltage of an unselected word line (e.g., word line layer or portion) which is in communication with one or more unselected memory cells, to be inhibited from being erased.

In the charge up phase, for the two-sided erase, Vs1 and Vb1 are stepped up to Verase from t3-t8 (waveform 1200). As a result, Vdg (the drain-to-gate voltage of the SGD or SGS select gates) is increased high enough so that GIDL is generated at the SGS and SGD select gates, charging up the body (Vbody). Verase is considered to be an erase voltage—it is sufficiently higher than Vsg to cause a significant amount of GIDL to charge up the body by a desired amount in a desired amount of time. In practice, as mentioned, Verase can exceed Vsg by at least about 4-6 V and perhaps about 10-15 V. Verase can range from about 15-25 V, as mentioned.

Vbody can be of a similar magnitude as Verase, perhaps 0-2 V lower. The rise in Vbody is coupled to the floating word lines so that Vwl_selected and Vwl_unselected rise up with Vbody. Vwl_selected and Vwl_unselected can be of a similar magnitude as Vbody, perhaps slightly lower.

In the erase phase, Vwl_selected is driven to a low level such as 0 V at t6-t7 to add holes into the charge trapping layer, lowering the Vth of the selected memory cells, as indicated by waveform 1212. Vwl_unselected continues to float so that holes are not added to the charge trapping layer for unselected memory cells.

For a one-sided erase, the preparation phase sets voltages as follows: Vbl (selected sets of NAND strings): raise from Vss to Vsg (waveform 1200); Vbl (inhibited sets of NAND strings): Vsg+Δ (waveform 1202); Vs1 (common to all NAND strings): Vsg+Δ (waveform 1202); Vsgs (selected sub-block): Vsg (waveform 1206); Vsgs (unselected sub-block): float (waveform 1204); Vsgd (selected sub-block): raise from Vss to Vsg (waveform 1206); Vsgd (unselected sub-block): float (waveform 1204); selected word lines: float (waveform 1214); and unselected word lines: float (waveform 1216).

The charge up phase sets voltages as follows: Vbl (selected sets of NAND strings): raise to Verase (waveform 1200); Vbl (inhibited sets of NAND strings): Vsg+Δ (waveform 1202); Vsl: Vsg+Δ (waveform 1202); Vsgs (selected sub-block): Vsg (waveform 1206); Vsgs (unselected sub-block): float (waveform 1204); Vsgd (selected sub-block): Vsg (waveform 1206); Vsgd (unselected sub-block): float (waveform 1204); selected word lines: float (waveform 1214); and unselected word lines: float (waveform 1216).

The erase phase sets voltages as follows: Vbl (selected sets of NAND strings): Verase (waveform 1200); Vbl (inhibited sets of NAND strings): Vsg+Δ (waveform 1202); Vsl: Vsg+Δ (waveform 1202); Vsgs (selected sub-block): Vsg (waveform 1206); Vsgs (unselected sub-block): float (waveform 1204); Vsgd (selected sub-block): Vsg (waveform 1206); Vsgd (unselected sub-block): float (waveform 1204); selected word lines: drive down to 0 V (waveform 1214); and unselected word lines: float (waveform 1216).

During the one-sided erase, Vsl=Vsg+Δ, as indicated by waveform 1202. Also, Vbl=Vsg+Δ (waveform 1202) for the inhibited sets of NAND strings. Vbl=Vsg+Δ or some other low voltage is considered to be an erase-inhibit voltage—it is not sufficiently higher than Vsg to cause a significant amount of GIDL to charge up the body. By applying Vsg+Δ, where Δ (delta) is about 0-2 V, for both inhibited bit lines and source lines, various advantages are achieved. First, essentially no GIDL will be generated at both the inhibited bit line and source line sides on a NAND string. A better select gate cutoff is achieved. Second, for the inhibited NAND strings, Vsg+Δ is sufficiently high so that both SGD and SGS are cut off, so that leakage is minimized. Third, Vsg+Δ is sufficiently low to avoid causing any erase in the inhibited NAND strings. Other approaches are possible but may be less advantageous. For example, floating the source line and the SGS select gate while applying a lower voltage such as 0 V to an inhibited bit line can result in a direct leakage path from a selected bit line to the inhibited bit line.

Since the GIDL is generated only at the drain end of the selected NAND strings in the one-sided erase, Vbody may charge up slightly slower compared to when GIDL is generated at both the drain and source ends of the selected NAND strings, but this does not significantly impair the erase operation.

Figure 13A:
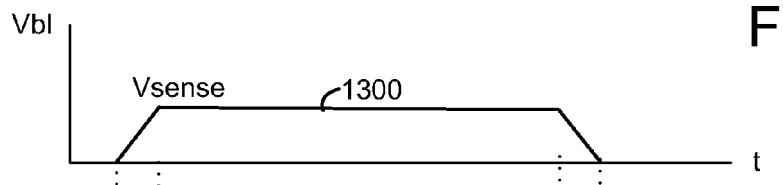
FIGS. 13A-13C depict voltages in the verify portion of an erase-verify iteration of an erase operation, consistent with FIGS. 9C and 9D.
Figure 13B:
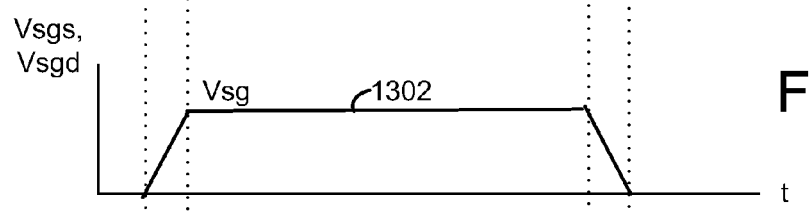
Figure 13C:
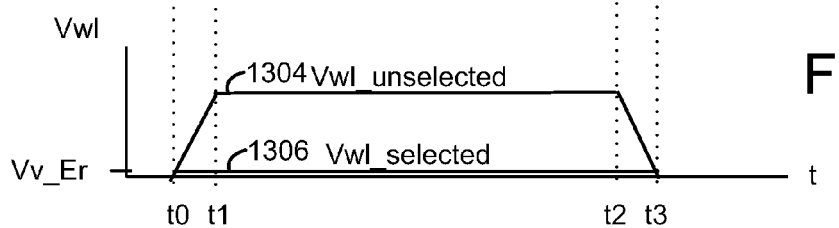

FIGS. 13A-13C depict voltages in the verify portion of an erase-verify iteration of an erase operation, consistent with FIGS. 9C and 9D. Different plots are provided showing changes in voltage on vertical axes versus time on the horizontal axis. The plots are time-aligned but not necessarily to scale. During the verify portion, an erase-verify test is performed in which the selected sets of NAND strings are sensed using sensing circuitry to determine whether the threshold voltages of the selected memory cells have passed the erase-verify test. The erase-verify test is passed when the threshold voltage of the selected memory cells are below Vv_Er.

During the sensing, Vbl is set to a sense voltage, Vsense (waveform 1300 in FIG. 13A). Vsgs and Vsgd (waveform 1302 in FIG. 13B) are set to a level such as Vsg which renders them conductive. Vsgs and Vsgd can be set to the same or different levels. Vwl_unselected (waveform 1304 in FIG. 13C) is set to a sufficiently high level, e.g., 8 V, to render the unselected memory cells in a conductive state. Vwl_selected (waveform 1306 in FIG. 13C) is set to Vv_Er.

In one approach, the verify portion involves performing the erase-verify test for the selected NAND strings in one sub-block at a time. Typically, each NAND string is verified separately from other NAND strings and the verifying occurs concurrently for the different NAND strings in a sub-block.

Figure 14A:
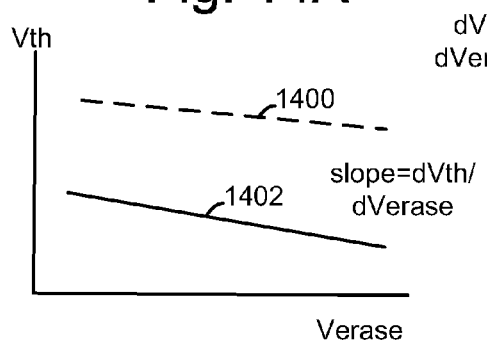
FIG. 14A is a plot depicting an observed behavior of a threshold voltage versus an erase voltage, for a fresh memory device and for a cycled memory device.

FIG. 14A is a plot depicting an observed behavior of a threshold voltage versus an erase voltage, for a fresh memory device (line 1402) and for a cycled memory device (line 1400). The slope of each line is dVth/dVerase. In this scenario, an erase pulse Verase was applied to a set of memory cells and the resulting Vth was measured. This was done for different values of Verase, and for a fresh memory device and a cycled memory device. For the fresh device, the erase speed is relatively high so that a relatively low Vth was reached. For the cycled device, the erase speed is relatively high low so that a relatively high Vth was reached. Moreover, the slope is shallower for the cycled memory device. As mentioned, if these changes are not accounted for, the number of erase loops can increase, resulting in an increased erase time.

Figure 14B:
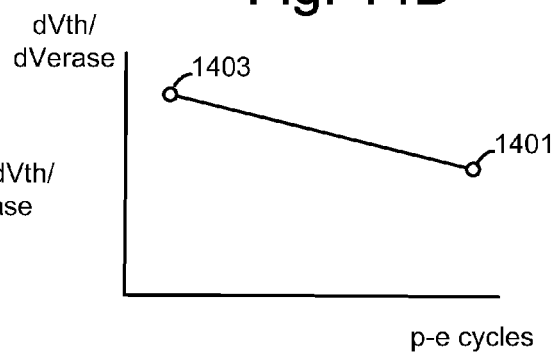
FIG. 14B is a plot depicting an observed behavior and a control setting of a change in a slope of threshold voltage/ erase voltage, as a function of program-erase cycles, consistent with FIG. 14A.

FIG. 14B is a plot depicting an observed behavior of a change in a slope of threshold voltage/erase voltage, as a function of p-e cycles, consistent with FIG. 14A. The fresh memory device corresponds to point 1403, and the cycled memory device corresponds to point 1401. As mentioned, the magnitude of the slope becomes lower as the number of p-e cycles increases.

Figure 14C:
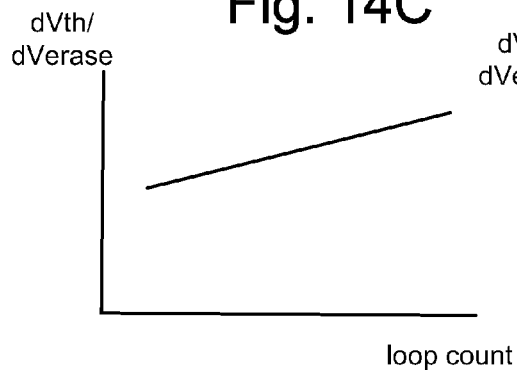
FIG. 14C is a plot depicting a control setting of a change in a slope of threshold voltage/erase voltage, as a function of loop count.

FIG. 14C is a plot depicting a control setting of a change in a slope of threshold voltage/erase voltage, as a function of loop count. The slope increases as loop count increases.

Figure 14D:
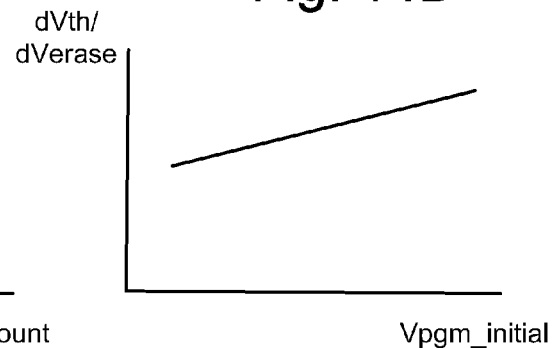
FIG. 14D is a plot depicting a control setting of a change in a slope of threshold voltage/erase voltage, as a function of Vpgm_initial.

FIG. 14D is a plot depicting a control setting of a change in a slope of threshold voltage/erase voltage, as a function of Vpgm_initial. The slope increases as Vpgm_initial increases.

Figure 14E:
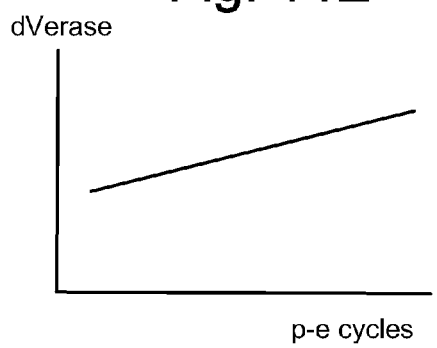
FIG. 14E is a plot depicting a control setting of a step size of an erase voltage, dVerase, as a function of program-erase cycles.

FIG. 14E is a plot depicting a control setting of a step size of an erase voltage, dVerase, as a function of p-e cycles. As a count of p-e cycles increases, dVerase can be increased. In one approach, the initial erase voltage is fixed even as dVerase increases. Alternatively, the initial erase voltage could also increase as a function of p-e cycles.

Generally, a single count of p-e cycles can be maintained for an entire block or array of memory cells. However, an erase operation can involve one or more selected word line layers and, alternatively, a separate count of p-e cycles can be maintained for each word line layer, or for groups of word lines layers which have a common memory hole diameter. Further, if the memory cells of one (e.g., only one) word line layer are being erased, the count of p-e cycles of that word line layer can be used to set dVerase. If the memory cells of multiple selected word line layers (all word line layers or fewer than all word line layers) are being erased, a representative count of p-e cycles can be determined based, e.g., on an average or median of the counts of the multiple word line layers. In this way, the erase operation can be tailored to the characteristics of the specific memory cells being erased.

Figure 14F:
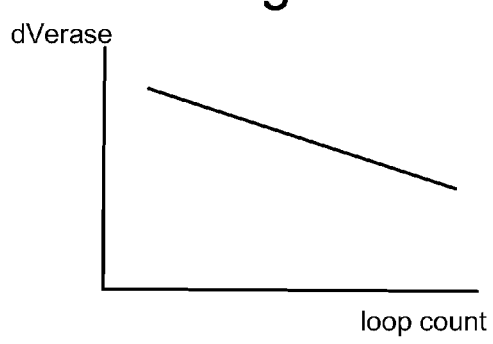

FIG. 14F is a plot depicting a control setting of a step size of an erase voltage, dVerase, as a function of a loop count which is determined during a programming operation. As a loop count decreases, a corresponding step size for the erase voltage increases.

A single loop count can be used for an entire block or array of memory cells. Or, a separate loop count can be maintained for different word line layers. In fact, the memory cells of the different word line layers can have different program speeds based on variations in the memory hole diameter. The programming speed will be faster (and the loop count lower) for memory cells adjacent to a narrower portion of the memory holes. The erase speed will be slower when the programming speed is faster.

If the memory cells of one (e.g., only one) word line layer are being erased, the loop count of that word line layer can be used to set dVerase. If the memory cells of multiple selected word line layers (all word line layers or fewer than all word line layers) are being erased, a representative loop count can be determined based, e.g., using an average or median of the loop counts of the multiple word line layers.

Figure 14G:
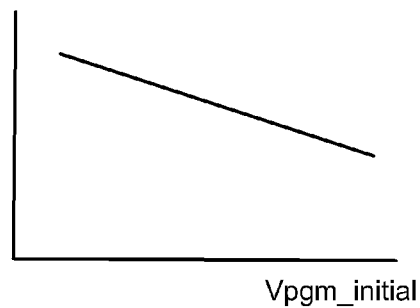

FIG. 14G is a plot depicting a control setting of a step size of an erase voltage, dVerase, as a function of Vpgm_initial, which is determined during a programming operation in accordance with. As Vpgm_initial decreases, indicating a higher count of p-e cycles, dVerase can be increased to compensate for the slower erasing which would otherwise occur.

A single Vpgm_initial can be used for an entire block or array of memory cells. Or, a separate Vpgm_initial can be maintained for different word line layers since the different word line layers can have different program speeds based on variations in the memory hole diameter. If the memory cells of one (e.g., only one) word line layer are being erased, the Vpgm_initial of that word line layer can be used to set dVerase. If the memory cells of multiple selected word line layers (all word line layers or fewer than all word line layers) are being erased, a representative Vpgm_initial can be determined based, e.g., using an average or median of the initial voltages of the multiple word line layers.

Figure 14H:
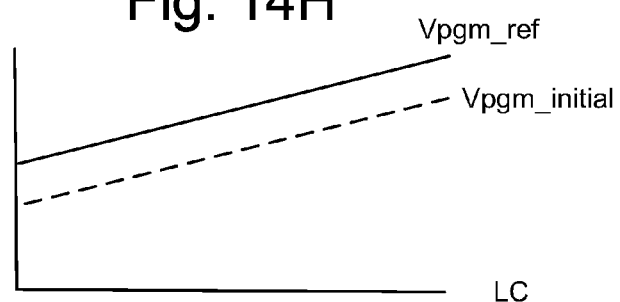
FIG. 14H is a plot depicting an observed behavior of Vpgm_ref and a control setting of Vpgm_initial as a function of a number of program loops needed to perform an initial amount of programming.

FIG. 14H is a plot depicting an observed behavior of Vpgm_ref (solid line) and a control setting of Vpgm_initial (dashed line) as a function of a number of program loops needed to perform an initial amount of programming. A higher number of program loops is associated with memory cells which have a slower programming speed. These are memory cells at relatively wider portions of a memory hole, and memory cells which have experienced a relatively small number of p-e cycles. A lower number of program loops is associated with memory cells which have a faster programming speed. These are memory cells at relatively narrower portions of a memory hole (see FIG. 14I), and memory cells which have experienced a relatively large number of p-e cycles (see FIG. 14J). In this example, there is a fixed offset between Vpgm_ref and Vpgm_initial. Further, Vpgm_ref>Vpgm_initial The offset is a function of the verify level (e.g., VvINT) which is used to determine the initial amount of programming and the verify level (e.g., VvA) of the lowest target data state which is used when starting a program pass from Vpgm_initial. If VvINT>VvA, the amount of programming used to cause the Vth of the memory cells to reach VvINT is more programming than is needed to cause the Vth of the memory cells to reach VvA. Thus, Vpgm_initial should be less than Vpgm_ref by an offset, as shown. If VvINT<VvA, the amount of programming used to cause the Vth of the memory cells to reach VvINT is less programming than is needed to cause the Vth of the memory cells to reach VvA. Thus, Vpgm_initial should be more than Vpgm_ref.

In another approach, the offset can vary as a function of the loop count so that Vpgm_initial is a non-linear function of the loop count and Vpgm_ref.

Figure 14I:
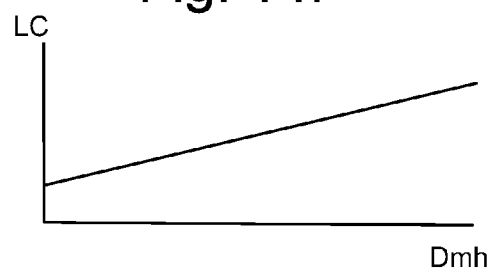
FIG. 14I is a plot depicting an observed behavior of a number of program loops needed to perform an initial amount of programming as a function of Dmh.

FIG. 14I is a plot depicting an observed behavior of a number of program loops needed to perform an initial amount of programming as a function of Dmh. The loop count (LC) increases as Dmh increases.

Figure 14J:
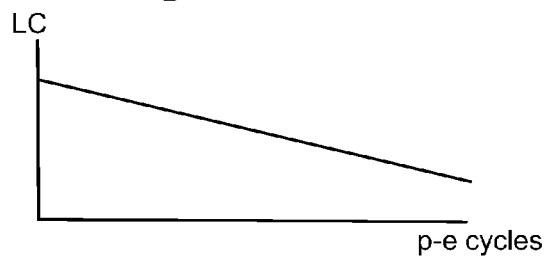
FIG. 14J is a plot depicting an observed behavior of a number of program loops needed to perform an initial amount of programming as a function of program-erase (p/e) cycles.

FIG. 14J is a plot depicting an observed behavior of a number of program loops needed to perform an initial amount of programming as a function of program-erase (p/e) cycles. The loop count (LC) decreases as the number of p-e cycles increases.

Accordingly, it can be seen that, in one embodiment, a method for erasing in a 3D stacked non-volatile memory device comprises: accessing data indicating an amount of program-erase cycles in the 3D stacked non-volatile memory device, the 3D stacked non-volatile memory device comprising alternating word line layers and dielectric layers and a plurality of NAND strings of memory cells formed in memory holes which extend through the layers, each memory cell has a control gate formed by one of the word line layers, and each NAND string comprises a drain end and a source end; and in connection with an erase operation of selected memory cells of one or more selected word line layers, applying a plurality of erase voltages, in turn, to at least one of the drain ends or the source ends of the NAND strings, each erase voltage charges up respective bodies of the NAND strings to a charged state, after which a voltage of the one or more selected word line layers is driven lower, so that threshold voltages of the selected memory cells are driven lower, wherein the plurality of erase voltages include an initial erase voltage and a subsequent erase voltage which is stepped up from the initial erase voltage by a step size which is based on the data, and the step size is relatively higher when the amount of program-erase cycles is relatively higher.

In another embodiment, a 3D stacked non-volatile memory device comprises: a stack comprising alternating word line and dielectric layers and a plurality of NAND strings of memory cells formed in memory holes which extend through the layers, each memory cell has a control gate formed by one of the word line layers, and each NAND string comprises a drain end and a source end; and a control circuit associated with the stack. The control circuit: accesses data indicating an amount of program-erase cycles in the 3D stacked non-volatile memory device and, in connection with an erase operation of selected memory cells of one or more selected word line layers, applies a plurality of erase voltages, in turn, to at least one of the drain ends or the source ends of the NAND strings, wherein each erase voltage charges up respective bodies of the NAND strings to a charged state, after which a voltage of the one or more selected word line layers is driven lower, so that threshold voltages of the selected memory cells are driven lower, the plurality of erase voltages include an initial erase voltage and a subsequent erase voltage which is stepped up from the initial erase voltage by a step size which is based on the data, and the step size is relatively higher when the amount of program-erase cycles is relatively higher.

In another embodiment, a method for erasing in a 3D stacked non-volatile memory device comprises: maintaining data indicating an amount of program-erase cycles in the 3D stacked non-volatile memory device, the 3D stacked non-volatile memory device comprising alternating word line and dielectric layers and a plurality of NAND strings of memory cells formed in memory holes which extend through the layers, each memory cell has a control gate formed by one of the word line layers, and each NAND string comprises a drain end and a source end; performing an initial erase iteration for selected memory cells of one or more selected word line layers by applying an initial erase voltage to at least one of the drain ends or the source ends of the NAND strings to charge up respective bodies of the NAND strings, and driving voltages of the one or more selected word line layers lower when the respective bodies of the NAND strings are in a charged state, the initial erase iteration causes threshold voltages of the selected memory cells to be driven lower to a threshold voltage distribution; performing a plurality of read operations to determine an upper tail of the threshold voltage distribution; determining a difference between the upper tail of the threshold voltage distribution and an erase-verify voltage; modifying the difference based on the data to provide a modified difference, wherein the modified difference is relatively higher when the amount of program-erase cycles is relatively higher; determining a subsequent erase voltage based on a sum of the initial erase voltage and the modified difference; and performing a subsequent erase iteration for the selected memory cells by applying the subsequent erase voltage to the at least one of the drain ends or the source ends of the NAND strings to charge up the respective bodies of the NAND strings, and driving voltages of the one or more selected word line layers lower when the respective bodies of the NAND strings are in the charged state.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for erasing in a 3D stacked non-volatile memory device, comprising:
accessing data indicating an amount of program-erase cycles in the 3D stacked non-volatile memory device, the 3D stacked non-volatile memory device comprising alternating word line layers and dielectric layers and a plurality of NAND strings of memory cells formed in memory holes which extend through the layers, each memory cell has a control gate formed by one of the word line layers, and each NAND string comprises a drain end and a source end; and
in connection with an erase operation of selected memory cells of one or more selected word line layers, applying a plurality of erase voltages, in turn, to at least one of the drain ends or the source ends of the NAND strings, each erase voltage charges up respective bodies of the NAND strings to a charged state, after which a voltage of the one or more selected word line layers is driven lower, so that threshold voltages of the selected memory cells are driven lower, wherein the plurality of erase voltages include an initial erase voltage and a subsequent erase voltage which is stepped up from the initial erase voltage by a step size which is based on the data, and the step size is relatively higher when the amount of program-erase cycles is relatively higher.

2. The method of claim 1, wherein:
after the initial erase voltage is applied to the at least one of the drain ends or the source ends of the NAND strings and before the subsequent erase voltage is applied to the at least one of the drain ends or the source ends of the NAND strings: a metric of a threshold voltage distribution of the selected memory cells is determined, and the step size is determined based on the metric and the data; and
the step size is relatively higher when the metric is relatively greater.

3. The method of claim 2, wherein:
the metric of the threshold voltage distribution is determined based on a difference between an upper tail of the threshold voltage distribution and an erase-verify voltage.

4. The method of claim 2, wherein:
the step size is determined from the metric of the threshold voltage distribution divided by a slope, where the slope is a magnitude of an expected change in threshold voltage of the selected memory cells with a change in the erase voltage, and the slope is relatively lower when the amount of program-erase cycles is relatively higher.

5. The method of claim 1, wherein:
the data indicating the amount of program-erase cycles comprises a count of the program-erase cycles; and
the step size is relatively higher when the count of the program-erase cycles is relatively higher.

6. The method of claim 1, wherein:
the data indicating the amount of program-erase cycles comprises a count of programming loops used to program at least a subset of the selected memory cells in a programming operation; and
the step size is relatively higher when the count of programming loops is relatively lower.

7. The method of claim 1, wherein:
the data indicating the amount of program-erase cycles comprises an initial program voltage which is adjusted based on a count of programming loops used to program at least a subset of the selected memory cells in a programming operation; and
the step size is relatively higher when the count of programming loops is relatively lower.

8. The method of claim 1, wherein:
the one or more selected word line layers comprise multiple selected word line layers; and
the data indicating an amount of program-erase cycles is maintained separately for each selected word line layer of the multiple selected word line layers.

9. The method of claim 8, wherein:
the data indicating the amount of program-erase cycles in the 3D stacked non-volatile memory device is based on an average or median of the data which is maintained separately for each selected word line layer.

10. The method of claim 1, wherein:
the plurality of erase voltages include at least one additional erase voltage which is stepped up by the step size after the subsequent erase voltage.

11. A 3D stacked non-volatile memory device, comprising:
a stack comprising alternating word line and dielectric layers and a plurality of NAND strings of memory cells formed in memory holes which extend through the layers, each memory cell has a control gate formed by one of the word line layers, and each NAND string comprises a drain end and a source end; and
a control circuit associated with the stack, the control circuit: accesses data indicating an amount of program-erase cycles in the 3D stacked non-volatile memory device and, in connection with an erase operation of selected memory cells of one or more selected word line layers, applies a plurality of erase voltages, in turn, to at least one of the drain ends or the source ends of the NAND strings, wherein each erase voltage charges up respective bodies of the NAND strings to a charged state, after which a voltage of the one or more selected word line layers is driven lower, so that threshold voltages of the selected memory cells are driven lower, the plurality of erase voltages include an initial erase voltage and a subsequent erase voltage which is stepped up from the initial erase voltage by a step size which is based on the data, and the step size is relatively higher when the amount of program-erase cycles is relatively higher.

12. The 3D stacked non-volatile memory device of claim 11, wherein:
after the initial erase voltage is applied to the at least one of the drain ends or the source ends of the NAND strings and before the subsequent erase voltage is applied to the at least one of the drain ends or the source ends of the NAND strings: a metric of a threshold voltage distribution of the selected memory cells is determined, and the step size is determined based on the metric and the data; and
the step size is relatively higher when the metric is relatively greater.

13. The 3D stacked non-volatile memory device of claim 11, wherein:
the data indicating the amount of program-erase cycles comprises a count of the program-erase cycles; and
the step size is relatively higher when the count of the program-erase cycles is relatively higher.

14. The 3D stacked non-volatile memory device of claim 11, wherein:
the data indicating the amount of program-erase cycles comprises a count of programming loops used to program at least a subset of the selected memory cells in a programming operation; and
the step size is relatively higher when the count of programming loops is relatively lower.

15. The 3D stacked non-volatile memory device of claim 11, wherein:
the plurality of erase voltages include at least one additional erase voltage which is stepped up by the step size after the subsequent erase voltage.

16. The 3D stacked non-volatile memory device of claim 11, wherein:
the one or more selected word line layers comprise multiple selected word line layers; and
the data indicating an amount of program-erase cycles is maintained separately for each selected word line layer of the multiple selected word line layers.

17. A method for erasing in a 3D stacked non-volatile memory device, comprising:
maintaining data indicating an amount of program-erase cycles in the 3D stacked non-volatile memory device, the 3D stacked non-volatile memory device comprising alternating word line and dielectric layers and a plurality of NAND strings of memory cells formed in memory holes which extend through the layers, each memory cell has a control gate formed by one of the word line layers, and each NAND string comprises a drain end and a source end;
performing an initial erase iteration for selected memory cells of one or more selected word line layers by applying an initial erase voltage to at least one of the drain ends or the source ends of the NAND strings to charge up respective bodies of the NAND strings, and driving voltages of the one or more selected word line layers lower when the respective bodies of the NAND strings are in a charged state, the initial erase iteration causes threshold voltages of the selected memory cells to be driven lower to a threshold voltage distribution;
performing a plurality of read operations to determine an upper tail of the threshold voltage distribution;
determining a difference between the upper tail of the threshold voltage distribution and an erase-verify voltage;
modifying the difference based on the data to provide a modified difference, wherein the modified difference is relatively higher when the amount of program-erase cycles is relatively higher;
determining a subsequent erase voltage based on a sum of the initial erase voltage and the modified difference; and
performing a subsequent erase iteration for the selected memory cells by applying the subsequent erase voltage to the at least one of the drain ends or the source ends of the NAND strings to charge up the respective bodies of the NAND strings, and driving voltages of the one or more selected word line layers lower when the respective bodies of the NAND strings are in the charged state.

18. The method of claim 17, wherein:
the voltages of the one or more selected word line layers are floated when the respective bodies of the NAND strings are being charged up to the charged state, during the initial erase iteration and the subsequent erase iteration.

19. The method of claim 17, wherein:
the data indicating the amount of program-erase cycles comprises a count of the program-erase cycles.

20. The method of claim 17, wherein:
the data indicating the amount of program-erase cycles comprises a count of programming loops used to program at least a subset of the selected memory cells in a programming operation.

* * * * *